United States Patent
Orihashi et al.

(10) Patent No.: US 7,123,659 B2
(45) Date of Patent: Oct. 17, 2006

(54) DIGITAL RECEPTION APPARATUS FOR REMOVING DISTORTION FROM RECEIVED SIGNALS

(75) Inventors: Masayuki Orihashi, Ichikawa (JP); Katsuaki Abe, Kawasaki (JP); Job Cleopa Msuya, Yokosuka (JP); Shinichiro Takabayashi, Kawasaki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 645 days.

(21) Appl. No.: 09/813,856

(22) Filed: Mar. 22, 2001

(65) Prior Publication Data

US 2001/0026596 A1    Oct. 4, 2001

(30) Foreign Application Priority Data

Mar. 23, 2000    (JP)    ............................. 2000-081226

(51) Int. Cl.
    H04B 14/04    (2006.01)
(52) U.S. Cl. .................. 375/243; 375/254; 341/200
(58) Field of Classification Search ................ 375/243, 375/316, 329, 332, 345, 346, 377, 245, 254, 375/234.1; 455/239.1, 240.1, 63.1, 67.13, 455/234.1; 329/304; 341/200
See application file for complete search history.

(56) References Cited

U.S. PATENT DOCUMENTS

| | | | | |
|---|---|---|---|---|
| 4,446,464 A | * | 5/1984 | LeGrand et al. | 342/399 |
| 4,746,902 A | * | 5/1988 | Tol et al. | 341/200 |
| 4,800,574 A | * | 1/1989 | Tanaka et al. | 375/243 |
| 5,301,364 A | * | 4/1994 | Arens et al. | 375/345 |
| 5,375,255 A | * | 12/1994 | Baier et al. | 375/349 |
| 5,594,612 A | * | 1/1997 | Henrion | 341/120 |
| 6,337,885 B1 | * | 1/2002 | Hellberg | 375/316 |
| 6,553,084 B1 | * | 4/2003 | Maru | 375/345 |
| 6,771,719 B1 | * | 8/2004 | Koyama et al. | 375/345 |
| 2003/0086513 A1 | * | 5/2003 | Ichihara | 375/345 |

FOREIGN PATENT DOCUMENTS

| | | |
|---|---|---|
| EP | 0378719 | 7/1990 |
| EP | 0395368 | 10/1990 |
| EP | 0482927 | 4/1992 |
| EP | 1133066 | 9/2001 |
| JP | 8-307281 | 11/1996 |

OTHER PUBLICATIONS

English Language Abstract of EP 0378719.
P. Fines et al., "Fully digital M-ary PSK and M-ary QAM demodulators for land mobile satellite communications", Electronics and Communication Engineering Journal, vol. 3, No. 6, pp. 291-298 (Dec. 1991).
English Language Abstract of JP 8-307281.

* cited by examiner

*Primary Examiner*—Betsy L. Deppe
(74) *Attorney, Agent, or Firm*—Greenblum & Bernstein, P.L.C.

(57) ABSTRACT

A digital reception apparatus includes a receiver that processes a received signal and a distortion corrector that corrects a non-linear distortion of the processed received signal, introduced by the receiver. The receiver may include an amplifier, a quadrature demodulator and/or a quantizer. The distortion corrector includes a distortion estimator that estimates the distortion and outputs a correcting signal based on an inverse distortion characteristic of the receiver, and a distortion compensator that multiplies the received signal and the correcting signal to remove the non-linear distortion from the received signal, to obtain a corrected received signal. The corrected signal is output to a demodulator, which performs demodulation processing on the corrected signal, and thereby obtains a demodulated signal.

4 Claims, 16 Drawing Sheets

QUANTIZED CODE

| INPUT SIGNAL | LINEAR QUANTIZED CODE | NON-LINEAR QUANTIZED CODE |
|---|---|---|
| −6 | −12 | −8 |
| −5 | −10 | −7 |
| −4 | −8 | −7 |
| −3 | −6 | −6 |
| −2 | −4 | −4 |
| −1 | −2 | −2 |
| 0 | 0 | 0 |
| +1 | +2 | +2 |
| +2 | +4 | +4 |
| +3 | +6 | +6 |
| +4 | +8 | +7 |
| +5 | +10 | +7 |
| +6 | +12 | +8 |

FIG. 11A

CONVERSION TABLE

| INPUT CODE | LINEARIZATION INFORMATION |
|---|---|
| −8 | −12 |
| −7 | −9 |
| −6 | −7 |
| −5 | −6 |
| −4 | −4 |
| −3 | −3 |
| −2 | −2 |
| −1 | −1 |
| 0 | 0 |
| +1 | +1 |
| +2 | +2 |
| +3 | +3 |
| +4 | +4 |
| +5 | +6 |
| +6 | +7 |
| +7 | +9 |
| +8 | +12 |

FIG. 11B

DIGITAL RECEPTION APPARATUS FOR REMOVING DISTORTION FROM RECEIVED SIGNALS

BACKGROUND OF THE INVENTION

1. Field of the Invention

The present invention relates to a reception apparatus used in a digital communication.

2. Description of the Related Art

Conventionally, in a reception apparatus used in a digital communication (hereinafter referred to as "digital reception apparatus"), on the assumption that the linearity is maintained in the reception processing on received signals, the demodulation processing has been executed on the received signals subjected to the reception processing. When the linearity is not maintained in the reception processing on received signals, characteristics of demodulated signals deteriorate which are obtained by performing the demodulation processing on the reception-processing processed received signals.

For example, a case is assumed that in the demodulation processing on the reception-processing processed received signals, unnecessary frequency signal components are divided from the reception-processing processed received signals to obtain only necessary frequency signal components. In this case, when the linearity is not maintained in the reception processing on received signals, it is difficult to divide the unnecessary frequency signal components from the reception-processing processed received signals, and also, even necessary frequency signal components are sometimes removed from the reception-processing processed received signals. The characteristics of the demodulated signals obtained by the demodulation processing thereby deteriorate.

Accordingly, the conventional digital reception apparatus is designed to highly maintain the linearity in the reception processing to the received signals.

Meanwhile, recent digital communications require communications for fast transmitting a large amount of information. In order to satisfy such a requirement, the quadrature amplitude modulation (QAM) or the like is applied as a modulation scheme, and/or the spread spectrum system in which a plurality of channels are multiplexed in a communication band and/or the OFDM (Orthogonal Frequency Division Multiplexing) system is used as a communication system.

However, when QAM or the like is applied as a modulation scheme, and/or the spread spectrum system and/or the OFDM system is used as a communication system, a signal amount per communication band is increased. Therefore, the power/amplitude of received signals is increased, which causes a problem that it becomes very difficult to maintain the linearity in the reception processing to the received signals. As a result, the characteristics of the demodulated signals obtained by the demodulation processing deteriorate.

Therefore, in the recent case where the communication system is applied that increases the signal amount per communication band, a technique has been quite desired that highly maintains the linearity in the reception processing in the digital reception apparatus.

SUMMARY OF THE INVENTION

It is an object of the present invention to provide a digital reception apparatus that maintains excellent characteristics in demodulation signals obtained by demodulating received signals. The object is achieved by using a characteristic of a receiving section that performs reception processing on the received signals, and thereby removing non-linear distortions from the reception-processing processed received signals.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 11A is a schematic view illustrating an example of a conversion table for use by a non-linearly quantizing section n the digital reception apparatus according to the ninth embodiment of the present invention;

FIG. 11B is a schematic view illustrating an example of a conversion table for use by a linearly compensating section in the digital reception apparatus according to the ninth embodiment of the present invention;

DETAILED DESCRIPTION OF THE PREFERRED EMBODIMENTS

Embodiments of the present invention will be described specifically below with reference to accompanying drawings.

First Embodiment

In this embodiment, a case is explained that distortion correction is performed to a received signal having a distortion due to the reception processing, using the inverse characteristic of an analog element that performs the reception processing.

Figure 1:
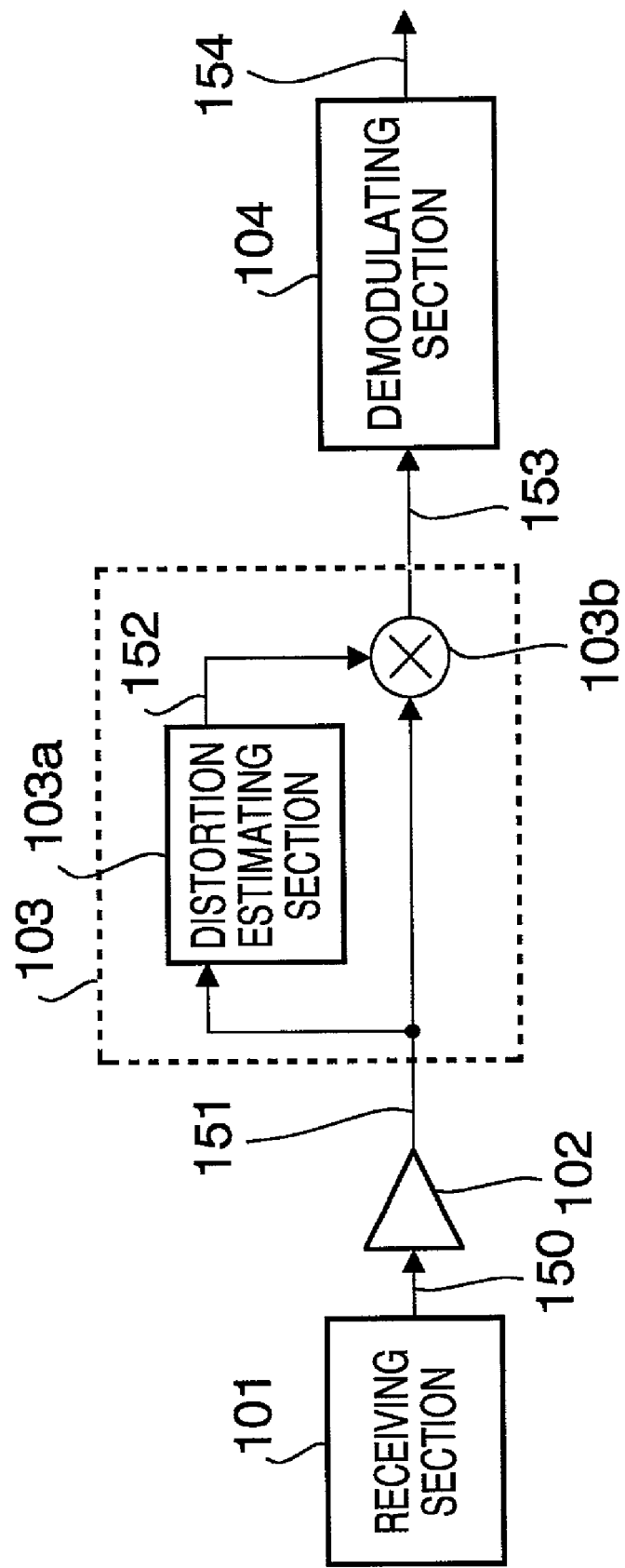
FIG. 1 is a block diagram illustrating a configuration of a digital reception apparatus according to a first embodiment of the present invention.

FIG. 1 is a block diagram illustrating a configuration of a digital reception apparatus according to the first embodiment of the present invention. The digital reception apparatus according to this embodiment is provided with receiving section 101, amplifying section 102, distortion correcting section 103 having distortion estimating section 103a and distortion compensating section 103b, and demodulating section 104.

The operation of the digital reception apparatus with the above configuration is explained. A signal transmitted from a transmitting-side apparatus (for example, a base station apparatus and mobile station apparatus) is received, through a propagation path, in receiving section 101 in the digital reception apparatus according to this embodiment. A signal 150 (received signal) received in receiving section 101 is amplified in amplifying section 102 to be an amplified signal 151. When the characteristic of amplifying section 102 contains a distortion, the characteristic of the amplified signal 151 obtained in amplifying section 102 also contains a distortion.

The amplified signal 151 is output to distortion estimating section 103a and distortion compensating section 103b in distortion correcting section 103.

Distortion estimating section 103a has information on the distortion characteristic of amplifying section 102 input beforehand thereto. Distortion estimating section 103a estimates a distortion component contained in the amplified signal 151, using the information on the distortion characteristic of amplifying section 102 and the amplified signal 151 from amplifying section 102. Further, using the estimated distortion component, the section 103a generates a correcting signal 152 to correct the distortion component of the amplified signal 151.

Distortion estimating section 103a is comprised of, for example, an element having the inverse characteristic of a section where the resultant signal needs the correction (in this case, amplifying section 102). When such an element receives as its input the amplified signal 151 from amplifying section 102, the element outputs a signal indicative of the inverse characteristic of the amplified signal 151 as the correcting signal 152.

The correcting signal 152 generated in distortion estimating section 103a is output to distortion compensating section 103b. Distortion compensating section 103b multiplies the amplified signal 151 from amplifying section 102 by the correcting signal 152 from distortion estimating section 103a. A corrected amplified signal 153 is thereby obtained which equals the amplified signal 151 from which the distortion component is removed. The obtained corrected amplified signal 153 is output to demodulating section 104. Demodulating section 104 performs the demodulation processing on the corrected amplified signal 153, and thereby obtains a demodulated signal 154.

The linearity in the aforementioned digital reception apparatus will be explained next. In the case where the amplified signal 151 obtained in amplifying section 152 contains a distortion, the linearity is not maintained in amplifying section 102. Accordingly, when demodulating section 104 demodulates the amplified signal obtained in amplifying section 102 with no correction or modification like in the conventional method, the characteristic of the demodulated signal obtained in demodulating section 104 deteriorates.

However, in this embodiment, the distortion of the amplified signal obtained in amplifying section 102 is removed in distortion compensating section 103b, and then the resultant signal is output to demodulating section 104. The linearity is thereby maintained in the reception processing (for example, the amplification in amplifying section 102) to the received signal. As a result, the characteristic of the demodulated signal 154 obtained in demodulating section 104 is maintained excellent.

The next description explains differences between the distortion correction performed by the digital reception apparatus according to this embodiment and the equalizing technique performed by an equalizer. The equalizing technique is such a technique that removes a distortion generated on a propagation path from a received signal, using estimated propagation path characteristics.

One of the large differences between the distortion correction performed in this embodiment and the equalizing technique is that kinds of signals to be subjected to the distortion correction are different therebetween. That is, the distortion correction is performed to a signal sequence in the equalizing technique (specifically, the distortion correction is performed using a previous signal sequence). In contrast thereto, the distortion correction is performed to an instantaneous signal in this embodiment.

Second one of the differences is whether the calculation processing for use in actually correcting a distortion is non-linear processing or linear processing. That is, in the equalizing technique, the distortion correction is performed by the calculation processing that fetches necessary signals from an input signal sequence based on a previous signal sequence. In other words, the calculation processing performed in correcting the distortion is the linear processing. In addition, as part of the signal sequence used in this calculation processing, non-linear information that is a judged result is used. In contrast to this, the calculation processing performed in correcting the distortion is the non-linear processing. That is, the compensation characteristic for the instantaneous power differs for each instantaneous power. For example, the case where the value of an input signal is 1 and the case where the value is 2 will be described here. When the compensation characteristic for an instantaneous power of each input signal is 1 and 0.7 respectively, a value of an output signal for the value of the former input signal becomes 1, and a value of an output signal for the value of the latter input signal becomes 1.4.

In the foregoing, the differences between the distortion correction performed by the digital reception apparatus according to this embodiment and the equalizing technique performed by an equalizer are explained.

Amplifying section 102 has the distortion characteristic that remains constant with respect to the amplitude of an input signal (or output signal). Accordingly, by inputting in advance the distortion characteristic to distortion estimating section 103*a*, using the distortion characteristic, distortion estimating section 103*a* is able to estimate the distortion component in the amplified signal 151 obtained in amplifying section 102. Further, distortion compensating section 103*b* is able to remove the distortion component in the amplified signal 151 obtained in amplifying section 102. According to such a method, distortion correcting section 103 is able to adopt a configuration with one input and with one output, and therefore, it is not necessary to change in particular a configuration of the digital reception apparatus.

According to this embodiment, it is possible to use even an amplifying element having a distortion in a demodulating system requiring the linearity. Further in the conventional method, in order to demodulate signals at a broad band where the amplitude varies greatly while maintaining the linearity, it is necessary to reserve the linearity in a wide range in every element composing the reception apparatus. However, according to this embodiment, it is made possible to remove a distortion readily from a received signal by inputting in advance the distortion characteristics of the whole receiving configuration to distortion estimating section 103*a*, whereby it is possible to make the reception apparatus miniaturized and inexpensive.

In the conventional method, the design on the linearity of elements composing the reception apparatus limits a range of received signals. Accordingly, the linearity of these elements is only maintained when characteristics of a received signal are predicted in advance. According to this embodiment, since the linearity can be maintained in a sufficiently wide range, the reception apparatus is effective particularly in a demodulation system that does not limit received signals in particular (for example, a system with the demodulating section achieved by software).

In the general reception apparatus, since the linear modulation/demodulation is basically adopted, it is preferable to use a linear amplifying element as amplifying section 102. However, all the amplifying elements have the distortion characteristic that the resultant is non-linear with respect to an input signal. The distortion characteristic is often caused by that output signals are saturated, and usually remains constant with respect to the instantaneous power of an input signal. Therefore, an input signal is uniquely determined with respect to the output signal. Accordingly, only using an output signal of amplifying section 102 (namely, amplified signal 151), distortion correcting section 103 is able to estimate an ideal output signal, in other words, to remove the distortion from the amplified signal 151 from amplifying section 102.

Meanwhile, when an input signal (received signal 150) is not uniquely determined with respect to the output signal (amplified signal 151) of amplifying section 102, distortion correcting section 103 outputs the information on some characteristic (for example, power) of the received signal 150 to distortion correcting section 103 without passing the information through amplifying section 102, whereby it is made possible to remove the distortion from the amplified signal 151. Further, in this case, if the effect is limited, it is possible to estimate an ideal output signal from the output signal (amplified signal 151) of amplifying section 102. However, in this case, there is a possibility that as a signal from which the distortion is removed, such a signal is obtained that is different from the ideal output signal.

When the distortion characteristic of amplifying section 102 is designed in advance, for example, when the distortion characteristic of amplifying section 102 is designed by an arithmetical calculation, distortion correcting section 103 is readily configured only with the inverse characteristic of amplifying section 102 given thereto, which facilitates the configuration of distortion correcting section 103. Further, if it is possible to measure or design in advance the distortion characteristic of amplifying section 102, it is possible to configure distortion correcting section 103 optimal for removing the distortion characteristic, and furthermore, for example, by representing a change in the distortion characteristic of amplifying section 102 by an arithmetical calculation or storing the change in a reference table, it is possible to configure distortion correcting section 103 with high applicability.

While this embodiment limits a distortion that distortion correcting section 103 corrects to only a distortion generated in amplifying section 102, the distortion that distortion correcting section 103 corrects is not limited in particular. In other words, distortion correcting section 103 is able to perform overall corrections including distortions generated in elements (analog circuits such as a filter element and a mixer element used in frequency conversion) other than amplifying section 102. It is thereby possible to obtain the distortion correction effects with higher accuracy.

As described above, in this embodiment, the distortion correction is performed to received signals with distortions caused by the reception processing, using the inverse characteristic of an analog element that executes the reception processing. The linearity is thereby maintained in the reception-processing processed received signals to be used in demodulation processing. Accordingly, the excellent characteristics are maintained in demodulated signals obtained by demodulating the reception-processing processed received signals.

Second Embodiment

Figure 2:
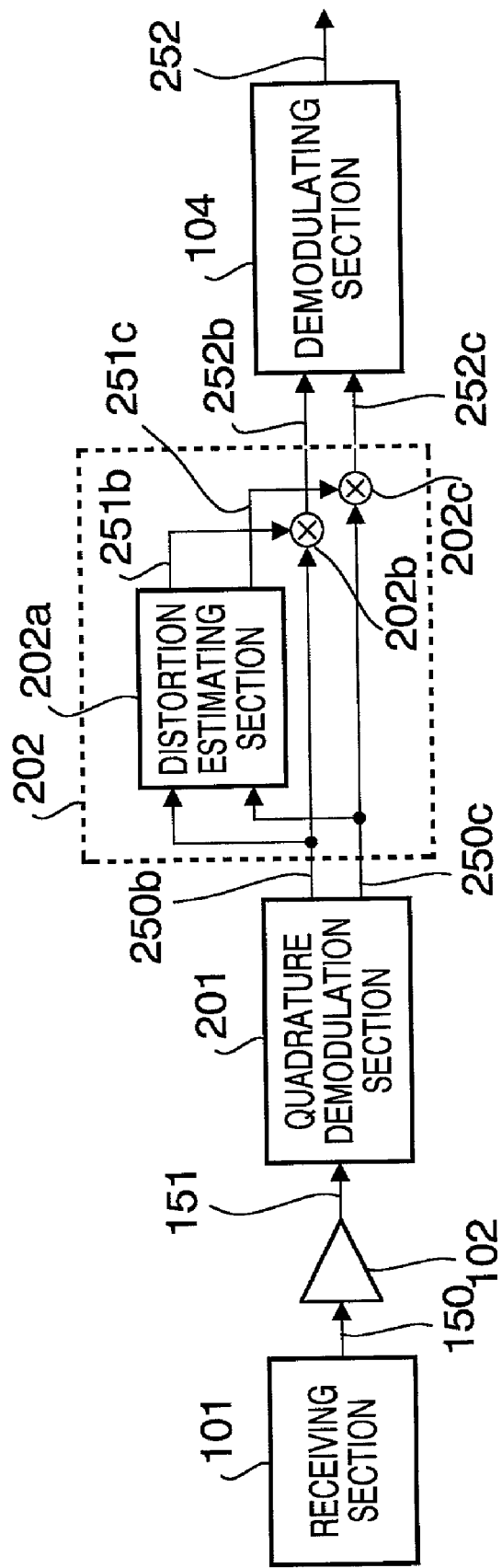
FIG. 2 is a block diagram illustrating a configuration of a digital reception apparatus according to a second embodiment of the present invention.

FIG. 2 is a block diagram illustrating a configuration of a digital reception apparatus according to the second embodiment of the present invention. In addition, in FIG. 2, the same sections as in the first embodiment (FIG. 1) are assigned the same reference numerals as in FIG. 1, and the detailed explanations are omitted.

The digital reception apparatus according to this embodiment is provided with receiving section 101, amplifying section 102, quadrature demodulation section 201, distortion correcting section 202 having distortion estimating section 202*a* and distortion compensating sections 202*b* and 202*c*, and demodulating section 104.

The operation of the digital reception apparatus with the above configuration is explained with attention only given to points different from the first embodiment.

The amplified signal 151 is demodulated in quadrature demodulation section 201 to be a baseband signal composed of an in-phase signal 250*b* and a quadrature signal 250*c*. The in-phase signal 250*b* (quadrature signal 250*c*) in the baseband signal is output to distortion estimating section 202*a* and to distortion compensating section 202*b* (distortion compensating section 202*c*) in distortion correcting section 202.

At this point, when the characteristic of amplifying section 102 contains a distortion, the characteristic of the amplified signal 151 obtained in amplifying section 102 also contains a distortion. Further, vector components of the distortion are also contained in the in-phase signal 205*b* and quadrature signal 205*c* in the baseband signal.

Distortion estimating section 202*a* has information on the vector components of the distortion characteristic of amplifying section 102 input beforehand thereto. Distortion estimating section 202a estimates the distortion components respectively contained in the in-phase signal 250b and quadrature signal 250c in the baseband signal obtained in quadrature demodulation section 201, using the information on the distortion characteristic of amplifying section 102, and the in-phase signal 250b and quadrature signal 250c in the baseband signal. Further, using the estimated distortion component, the section 202a generates a correcting signal 251b (correcting signal 251c) to correct the distortion component of the in-phase signal 250b (quadrature signal 250c) in the baseband signal.

Distortion estimating section 202a is comprised of, for example, an element having the inverse characteristic of a section where the resultant signal needs the correction (in this case, amplifying section 102). Generally, vector represented components of the distortion characteristic of amplifying section 102 are not lost and contained in the baseband signal obtained in quadrature demodulation section 201. Accordingly, when such an element receives as its input the in-phase signal 250b (quadrature signal 250c) in the baseband signal from quadrature demodulation section 201, the element outputs a signal indicative of the inverse characteristic concerning on a distortion contained in the in-phase signal 250b (quadrature signal 250c) in the baseband signal as the correcting signal 251b (correcting signal 251c). In addition, that the distortion characteristic of amplifying section 102 is represented by vectors is, in detail, equal to that the distortion is represented by vectors with an amplitude component and a phase component.

The correcting signal 251b (correcting signal 251c) generated in distortion estimating section 202a is output to distortion compensating section 202b (distortion compensating section 202c). Distortion compensating section 202b (distortion compensating section 202c) multiplies the in-phase signal 250b (quadrature signal 250c) from quadrature demodulation section 201 by the correcting signal 251b (correcting signal 251c) from distortion estimating section 202a. A corrected amplified signal 252b (corrected amplified signal 252c) is thereby obtained which equals the in-phase signal 250b (quadrature signal 250c) from which the distortion component is removed.

The obtained corrected amplified signals 252b and 252c are output to demodulating section 104. Demodulating section 104 performs the demodulation processing on the corrected amplified signals 252b and 252c, and thereby obtains a demodulated signal 252.

Amplifying section 102 has the distortion characteristic that remains constant with respect to the amplitude of an input signal (or output signal). Further, components of the distortion characteristic represented by vectors are not lost after being subjected to the quadrature demodulation. Accordingly, by inputting in advance the distortion characteristic as vector values to distortion estimating section 202a, using the distortion characteristic, distortion estimating section 202a is able to estimate the distortion component in the amplified signal 151 obtained in amplifying section 102 (i.e., the distortion component in the baseband signal obtained in quadrature demodulation section 201). Further, distortion compensating section 202b (distortion compensating section 202c) is able to remove the distortion component in the in-phase signal 250b (quadrature signal 250c).

According to such a method, since the distortion characteristic of amplifying section 102 is represented by vectors, distortion correcting section 202 is able to correct the amplitude distortion and phase distortion in the baseband signal obtained in quadrature demodulation section 201. It is thereby possible to reserve the particularly high linearity in the corrected amplified signals 252b and 252c with the distortion corrected in distortion correcting section 202.

According to this embodiment, it is possible to use even an amplifying element having a distortion in a demodulating system requiring the linearity. Further in the conventional method, in order to demodulate signals at a broad band where the amplitude varies greatly while maintaining the linearity, it is necessary to reserve the linearity in a wide range in every element composing the reception apparatus. However, according to this embodiment, by inputting in advance the distortion characteristics of the whole receiving configuration to distortion estimating section 202a, it is made possible to remove a distortion readily from a received signal, and a range of the amplitude of manageable signals expands, whereby it is possible to make the reception apparatus miniaturized and inexpensive.

In the conventional method, the design on the linearity of elements composing the reception apparatus limits a range of received signals. Accordingly, the linearity of these elements is only maintained when characteristics of a received signal are predicted in advance. According to this embodiment, since the linearity can be maintained in a sufficiently wide range, the reception apparatus is effective particularly in a demodulation system that does not limit received signals in particular (for example, a system with the demodulating section achieved by software).

In the general reception apparatus, since the linear modulation/demodulation is basically adopted, it is preferable to use a linear amplifying element as amplifying section 102. However, all the amplifying elements have the distortion characteristic that the resultant is non-linear with respect to an input signal. The distortion characteristic is often caused by that output signals are saturated, and usually remains constant with respect to the instantaneous power of an input signal. Therefore, an input signal is uniquely determined with respect to the output signal. Accordingly, only using an output signal of quadrature demodulation section 201 (namely, the in-phase signal 250b and quadrature signal 250c in the baseband signal), distortion correcting section 202 is able to estimate an ideal output signal, in other words, to remove the distortion from the baseband signal from quadrature demodulation section 201.

Meanwhile, when an input signal (received signal 150) is not uniquely determined with respect to the output signal (amplified signal 151) of amplifying section 102, distortion correcting section 202 outputs the information on some characteristic (for example, power) of the received signal 150 to distortion correcting section 202 without passing the information through amplifying section 102, whereby it is made possible to remove the distortion from the amplified signal 151.

Further, in this case, if the effect is limited, it is possible to estimate an ideal output signal from the output signal (amplified signal 151) of amplifying section 102. However, in this case, there is a possibility that as a signal from which the distortion is removed, such a signal is obtained that is different from the ideal output signal.

When the distortion characteristic of amplifying section 102 is designed in advance, for example, when the distortion characteristic of amplifying section 102 is designed by an arithmetical calculation, distortion correcting section 202 is readily configured only with the inverse characteristic of amplifying section 102 given thereto, which facilitates the configuration of distortion correcting section 202. Further, if it is possible to measure or design in advance the distortion characteristic of amplifying section 102, it is possible to configure distortion correcting section 202 optimal for removing the distortion characteristic, and furthermore, for example, by representing a change in the distortion characteristic of amplifying section 102 by an arithmetical calculation or storing the change in a reference table, it is possible to configure distortion correcting section 202 with high applicability.

While this embodiment limits a distortion that distortion correcting section 202 corrects to only a distortion generated in amplifying section 102, the distortion that distortion correcting section 202 corrects is not limited in particular. In other words, distortion correcting section 202 is able to perform overall corrections including distortions generated in elements (analog circuits such as a filter element and a mixer element used in frequency conversion) other than amplifying section 102. It is thereby possible to obtain the distortion correction effects with higher accuracy.

As described above, in this embodiment, the distortion correction is performed to received signals with distortions caused by the reception processing, using the inverse characteristic of an analog element that executes the reception processing. The linearity is thereby maintained in the reception-processing processed received signals to be used in demodulation processing. Accordingly, the excellent characteristics are maintained in demodulated signals obtained by demodulating the reception-processing processed received signals. Further, in this embodiment, since the distortion correction is performed to the baseband signal obtained by the quadrature demodulation, it is possible to remove both the amplitude distortion and phase distortion in the received signals to be input to the demodulating section.

Third Embodiment

Figure 3:
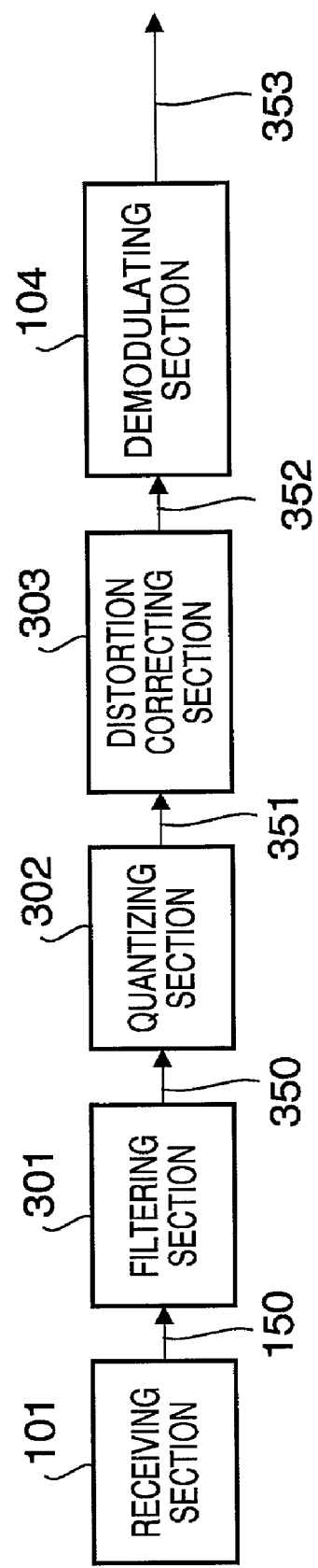
FIG. 3 is a block diagram illustrating a configuration of a digital reception apparatus according to a third embodiment of the present invention.

FIG. 3 is a block diagram illustrating a configuration of a digital reception apparatus according to the third embodiment of the present invention. In addition, in FIG. 3, the same sections as in the first embodiment (FIG. 1) are assigned the same reference numerals as in FIG. 1, and the detailed explanations are omitted.

The digital reception apparatus according to this embodiment is provided with receiving section 101, filtering section 301, quantizing section 302, distortion correcting section 303, and demodulating section 104.

The operation of the digital reception apparatus with the above configuration is explained with attention only given to points different from the first embodiment.

The received signal 150 from receiving section 101 is subjected the band limitation in filtering section 301 which cancels refrain errors and so on. A band limited signal 350 is thereby obtained. The obtained band limited signal 350 is output to quantizing section 302.

Quantizing section 302 performs quantization (i.e., non-linear quantization) on the band limited signal 350, while changing a quantization step corresponding to the amplitude of the band limited signal 350 input thereto. A non-linear quantized signal 351 is thereby obtained. In addition, the non-linear quantization will be described specifically later. The obtained non-linear quantized signal 351 is output to distortion correcting section 303.

Distortion correcting section 303 has information on the relationship between an input signal and output signal in quantizating section 303 input beforehand thereto. Using the information, distortion correcting section 303 linearizes the non-linear quantized signal 351. A corrected quantized signal 352 is thereby obtained. The obtained corrected quantized signal 352 is demodulated in demodulating section 104. A demodulated signal 353 is thereby obtained.

In the conventional quantization, the whole range of the amplitude available for received signals to be quantized is divided into a plurality of quantization steps each with a constant signal width, and each quantization step is assigned a code specific to the quantization step. This processing equals dispersing a quantization error over all the signals with equal levels. Then, the whole range of the amplitude available for received signals to be quantized is divided into a plurality of quantization steps with mutually different signal widths, and each quantization step is subjected to demodulation specific to the quantization step, whereby the quantization error changes, and thereby can be adjusted corresponding to the amplitude of the signal.

Using the above processing enables the adjustment of a noise to be provided to the digital reception apparatus. The reception characteristics of the digital reception apparatus are determined by a system noise represented by noise index, quantization error, calculation error, etc. The system noise remains almost constant regardless of received level, and the effect of the calculation error tends to decrease as the amplitude of a signal to be processed increases.

Therefore, for example, by making the sum of the quantization error and calculation error constant, or by sacrificing the characteristic at a high C/N environment, it is possible to increase the quantization error as the amplitude of a signal increases. Specifically, the quantizing section assigns a quantization step with a small signal width to a received signal with the small amplitude, while assigning a quantization step with a large signal width to a received signal with the large amplitude. The quantization noise caused by the quantization error is thereby weighted largely on the received signal with the large amplitude, whereby it is possible to make the sum of the quantization error and calculation error constant.

Using such non-linear quantization, it is possible to expand the whole range of the amplitude of received signals to be quantized without increasing the quantization number (resolution). Further, by adjusting quantization steps to be optimal, it is possible to achieve the quantization with the small quantization number. In particular, by designing the quantization steps corresponding to a modulation scheme used in communications and an expected reception environment, it is possible to design a digital reception apparatus that performs highly efficient reception.

According to this embodiment, it is possible to use even an amplifying element having a distortion in a demodulating system requiring the linearity. Further in the conventional method, in order to demodulate signals at a broad band where the amplitude varies greatly while maintaining the linearity, it is necessary to reserve the linearity in a wide range in every element composing the reception apparatus. However, according to this embodiment, it is made possible to remove a distortion readily from a received signal by inputting in advance the distortion characteristics of the whole receiving configuration to distortion estimating section 303, whereby it is possible to make the reception apparatus miniaturized and inexpensive.

In the conventional method, the design on the linearity of elements composing the reception apparatus limits a range of received signals. Accordingly, the linearity of these elements is only maintained when characteristics of a received signal are predicted in advance. According to this embodiment, since the linearity can be maintained in a sufficiently wide range, the reception apparatus is effective particularly in a demodulation system that does not limit received signals in particular (for example, a system with the demodulating section achieved by software).

In the general reception apparatus, since the linear modulation/demodulation is basically adopted, it is preferable to use a linear amplifying element as amplifying section 102. However, all the amplifying elements have the distortion characteristic that the resultant is non-linear with respect to an input signal. The distortion characteristic is often caused by that output signals are saturated, and usually remains constant with respect to the instantaneous power of an input signal. Therefore, an input signal is uniquely determined with respect to the output signal. Distortion correcting section 303 is able to estimate an ideal output signal with the distortion component of each element removed, as well as correcting the non-linearity caused by the non-linear quantization in quantizing section 302.

When the distortion characteristic of quantizing section 302 is designed in advance, for example, when the distortion characteristic of quantizing section 302 is designed by an arithmetical calculation, distortion correcting section 303 is readily configured only with the inverse characteristic of quantizing section 302 given thereto, which facilitates the configuration of distortion correcting section 303. Further, if it is possible to measure or design in advance the distortion characteristic of quantizing section 302, it is possible to configure distortion correcting section 303 optimal for removing the distortion characteristic, and furthermore, for example, by representing a change in the distortion characteristic of quantizing section 302 by an arithmetical calculation or storing the change in a reference table, it is possible to configure distortion correcting section 303 with high applicability.

The configuration of quantizing section 302 is not limited to the above-mentioned configuration. Quantizing section 302 may be configured by, for example, making intervals of reference power non-equal intervals in a quantizer having a combination of a plurality of power comparators and the reference power.

Further, quantizing section 302 may be configured by, for example, changing a configuration of a digital filter corresponding to the amplitude in a quantizer having a power comparator and reference power, some integrators and differentiaters, and the digital filter. In this case, since it is possible to achieve the integrators, differentiaters, digital filter and the like by the software (computer program), the digital filter according to this embodiment may be achieved further readily.

Distortion correcting section 303 handles quantization information, and therefore is capable of being composed of a conventional logical circuit, or of being achieved by the software (computer program).

Fourth Embodiment

Figure 4:
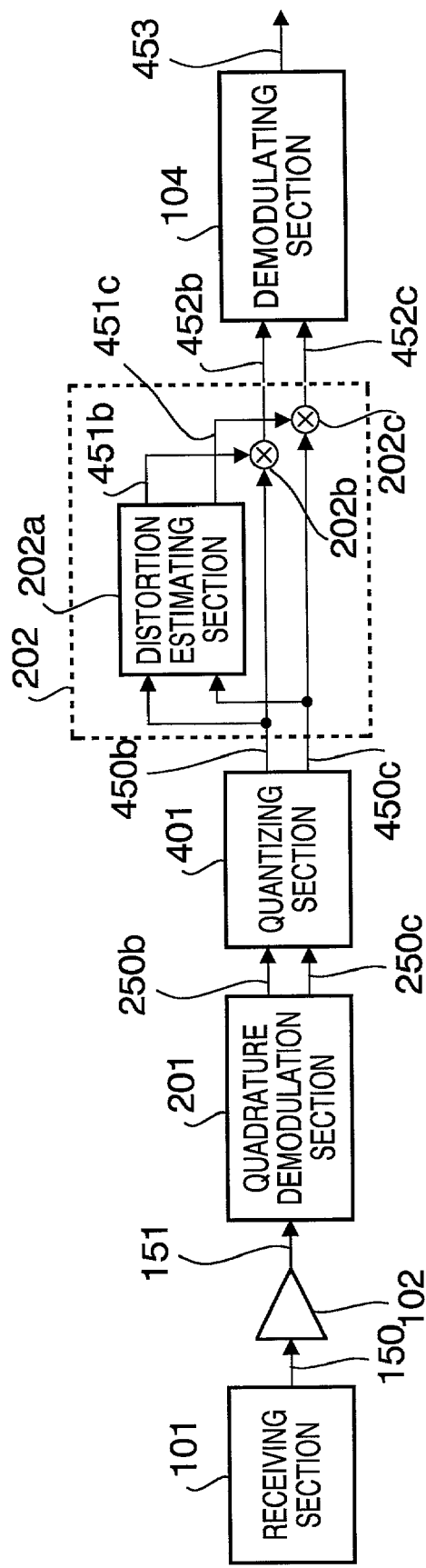
FIG. 4 is a block diagram illustrating a configuration of a digital reception apparatus according to a fourth embodiment of the present invention.

FIG. 4 is a block diagram illustrating a configuration of a digital reception apparatus according to the fourth embodiment of the present invention. In addition, in FIG. 4, the same sections as in the second embodiment (FIG. 2) are assigned the same reference numerals as in FIG. 2, and the detailed explanations are omitted.

The digital reception apparatus according to this embodiment is provided with receiving section 101, amplifying section 102, quadrature demodulation section 201, quantizing section 401, distortion correcting section 202 having distortion estimating section 202a and distortion compensating sections 202b and 202c, and demodulating section 104.

The operation of the digital reception apparatus with the above configuration is explained with attention only given to points different from the second embodiment.

The in-phase signal 250b and quadrature signal 250c in the baseband signal obtained in quadrature demodulation section 201 are quantized in quantizing section 401. A quantized baseband signal containing an in-phase signal 450b and quadrature signal 450c is thereby generated. The generated in-phase signal 450b (quadrature signal 450c) in the quantized baseband signal is output to distortion estimating section 202a and to distortion compensating section 202b (distortion compensating section 202c).

At this point, when the characteristic of amplifying section 102 contains a distortion, the characteristic of the amplified signal 151 obtained in amplifying section 102 also contains a distortion. Further, vector components of the distortion are also contained in the in-phase signal 250b and quadrature signal 250c in the baseband signal.

Distortion estimating section 202a has information on the vector components of the distortion characteristic of amplifying section 102 input beforehand thereto. Distortion estimating section 202a estimates the distortion components respectively contained in the in-phase signal 450b and quadrature signal 450c in the quantized baseband signal obtained in quantizing section 401, using the information on the distortion characteristic of amplifying section 102, and the in-phase signal 450b and quadrature signal 450c in the quantized baseband signal. Further, using the estimated distortion component, the section 202a generates a correcting signal 451b (correcting signal 451c) to correct the distortion component of the in-phase signal 450b (quadrature signal 451c) in the quantized baseband signal.

The correcting signal 451b (correcting signal 451c) generated in distortion estimating section 202a is output to distortion compensating section 202b (distortion compensating section 202c). Distortion compensating section 202b (distortion compensating section 202c) multiplies the in-phase signal 450b (quadrature signal 450c) from quantizing section 401 by the correcting signal 451b (correcting signal 451c) from distortion estimating section 202a. An in-phase signal 452b (quadrature signal 452c) as a corrected baseband signal is thereby obtained which equals the in-phase signal 450b (quadrature signal 450c) from which the distortion component is removed.

The obtained in-phase signal 452b and quadrature signal 452c in the corrected baseband signal are output to demodulating section 104. Demodulating section 104 performs the demodulation processing on the in-phase 452b and quadrature signal 452c in the corrected baseband signal, and thereby obtains a demodulated signal 453.

Amplifying section 102 has the distortion characteristic that remains constant with respect to the amplitude of an input signal (or output signal). Further, components of the distortion characteristic represented by vectors are not lost after being subjected to the quadrature demodulation. Accordingly, by inputting in advance the distortion characteristic as vector values to distortion estimating section 202a, using the distortion characteristic, distortion estimating section 202a is able to estimate the distortion component in the amplified signal 151 obtained in amplifying section 102 (i.e., the distortion component in the baseband signal obtained in quadrature demodulation section 201). Further, distortion compensating section 202b (distortion compensating section 202c) is able to remove the distortion component in the in-phase signal 450b (quadrature signal 450c).

According to such a method, since the distortion characteristic of amplifying section 102 is represented by vectors, distortion correcting section 202 is able to correct the amplitude distortion and phase distortion in the baseband signal obtained in quadrature demodulation section 201. It is thereby possible to reserve the particularly high linearity in the corrected amplified signals 452*b* and 452*c* with the distortion corrected in distortion correcting section 202.

According to this embodiment, it is possible to use even an amplifying element having a distortion in a demodulating system requiring the linearity. Further in the conventional method, in order to demodulate signals at a broad band where the amplitude varies greatly while maintaining the linearity, it is necessary to reserve the linearity in a wide range in every element composing the reception apparatus. However, according to this embodiment, by inputting in advance the distortion characteristics of the whole receiving configuration to distortion estimating section 202*a*, it is made possible to remove a distortion readily from a received signal, whereby it is possible to make the reception apparatus miniaturized and inexpensive.

When a signal with large power transmitted on an adjacent channel is input as an interfering signal to the digital reception apparatus according to this embodiment, it is necessary to set a range of quantization in quantizing section 401 to be large. However, under the condition that the resolution is the same in the quantization, the quantization errors are increased, and the characteristic of a demodulated signal deteriorates. Then, it is possible to provide a distortion characteristic for limiting the amplitude to the amplified signal 151 in amplifying section 102 disposed at a first part, and to perform the distortion correction corresponding to the distortion characteristic in distortion correcting section 202 disposed at a latter part. It is thereby possible to provide a weight of the quantization error from a signal with low power to a signal with high power, and therefore even under the condition of the same quantization resolution, the characteristic of a demodulated signal does not deteriorate in particular.

In the conventional method, the design on the linearity of elements composing the reception apparatus limits a range of received signals. Accordingly, the linearity of these elements is only maintained when characteristics of a received signal are predicted in advance. According to this embodiment, since the linearity can be maintained in a sufficiently wide range, the reception apparatus is effective particularly in a demodulation system that does not limit received signals in particular (for example, a system with the demodulating section achieved by software).

In the general reception apparatus, since the linear modulation/demodulation is basically adopted, it is preferable to use a linear amplifying element as amplifying section 102. However, all the amplifying elements have the distortion characteristic that the resultant is non-linear with respect to an input signal. The distortion characteristic is often caused by that output signals are saturated, and usually remains constant with respect to the instantaneous power of an input signal. Therefore, an input signal is uniquely determined with respect to the output signal. Accordingly, only using an output signal of amplifying section 102 (i.e., the amplified signal 151), distortion correcting section 202 is able to estimate an ideal output signal, in other words, to remove the distortion from the amplified signal 151 from amplifying section 102.

Meanwhile, when an input signal (received signal 150) is not uniquely determined with respect to the output signal (amplified signal 151) of amplifying section 102, distortion correcting section 202 outputs the information on some characteristic (for example, power) of the received signal 150 to distortion correcting section 202 without passing the information through amplifying section 102, whereby it is made possible to remove the distortion from the amplified signal 151. Further, in this case, if the effect is limited, it is possible to estimate an ideal output signal from the output signal (amplified signal 151) of amplifying section 102. However, in this case, there is a possibility that as a signal from which the distortion is removed, such a signal is obtained that is different from the ideal output signal.

When the distortion characteristic of amplifying section 102 is designed in advance, for example, when the distortion characteristic of amplifying section 102 is designed by an arithmetical calculation, distortion correcting section 202 is readily configured only with the inverse characteristic of amplifying section 102 given thereto, which facilitates the configuration of distortion correcting section 202. Further, if it is possible to measure or design in advance the distortion characteristic of amplifying section 102, it is possible to configure distortion correcting section 202 optimal for removing the distortion characteristic, and furthermore, for example, by representing a change in the distortion characteristic of amplifying section 102 by an arithmetical calculation or storing the change in a reference table, it is possible to configure distortion correcting section 202 with high applicability.

While this embodiment limits a distortion that distortion correcting section 202 corrects to only a distortion generated in amplifying section 102, the distortion that distortion correcting section 202 corrects is not limited in particular. In other words, distortion correcting section 202 is able to perform overall corrections including distortions generated in elements (analog circuits such as a filter element and a mixer element used in frequency conversion) other than amplifying section 102. It is thereby possible to obtain the distortion correction effects with higher accuracy.

While in this embodiment, amplifying section 102 and quantizing section 401 are provided as independent elements, it may be possible to alternate the position of amplifying section 102 and that of quadrature demodulation section 201 to provide amplifying section 102 as an input amplifier for quantizing section 401. In this case, a non-linear quantizing element may be composed of amplifying section 102 and quantizing section 401.

Distortion correcting section 202 handles a quantized baseband signal from quantizing section 401, i.e., handles quantization information. Accordingly, distortion correcting section 203 is capable of being composed of a conventional logical circuit, or of being achieved by the software (computer program).

As described above, in this embodiment, the distortion correction is performed to received signals with distortions caused by the reception processing, using the inverse characteristic of an analog element that executes the reception processing. The linearity is thereby maintained in the reception-processing processed received signals to be used in demodulation processing. Accordingly, the excellent characteristics are maintained in demodulated signals obtained by demodulating the reception-processing processed received signals. Further, in this embodiment, since the distortion correction is performed to the baseband signal obtained by the quadrature demodulation, it is possible to remove both the amplitude distortion and phase distortion in the received signals to be input to the demodulating section. In addition to the foregoing, in this embodiment, received signals with distortions caused by the reception processing are converted into digital signals, and the distortion correction is performed to the digital received signals. In other words, the received signals are processed as digital signals when the distortion correction is performed thereto. The digital reception apparatus according to this embodiment is thereby capable of obtaining the characteristics with high accuracy and with stability.

Fifth Embodiment

Figure 5:
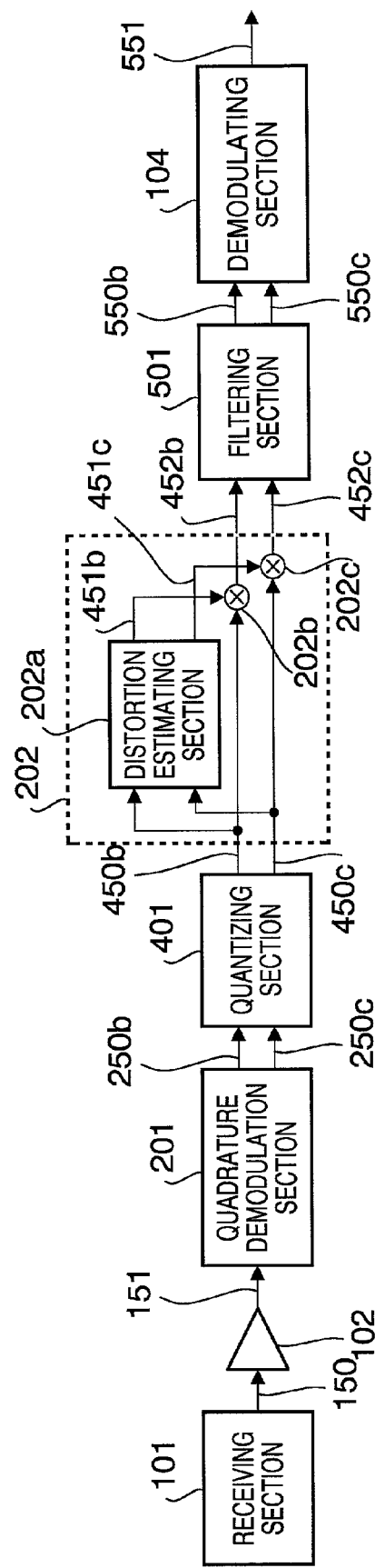
FIG. 5 is a block diagram illustrating a configuration of a digital reception apparatus according to a fifth embodiment of the present invention.

FIG. 5 is a block diagram illustrating a configuration of a digital reception apparatus according to the fifth embodiment of the present invention. In addition, in FIG. 5, the same sections as in the fourth embodiment (FIG. 4) are assigned the same reference numerals as in FIG. 4, and the detailed explanations are omitted.

The digital reception apparatus according to this embodiment is provided with receiving section 101, amplifying section 102, quadrature demodulation section 201, quantizing section 401, distortion correcting section 202 having distortion estimating section 202a and distortion compensating sections 202b and 202c, filtering section 501, and demodulating section 104.

The operation of the digital reception apparatus with the above configuration is explained with attention only given to points different from the fourth embodiment.

Filtering section 501 limits the frequency band of the in-phase signal 452b (quadrature signal 452c) in the corrected baseband signal. An in-phase signal 550b (quadrature signal 550c) in a band limited baseband signal is thereby obtained. Generally, frequencies adjacent to the frequency used in communications by the digital reception apparatus are used in communications by other communication apparatuses. Accordingly, there is a possibility that received signals of the digital reception apparatus contain signals transmitted from the aforementioned other communication apparatuses. However, the band limitation performed by filtering section 501 suppresses adverse effects by the aforementioned other communication apparatuses in the band limited baseband signals.

Demodulating section 104 demodulates the obtained in-phase signal 550b and quadrature signal 550c in the band limited baseband signal. Thereby a demodulated signal 551 is obtained.

Amplifying section 102 has the distortion characteristic that remains constant with respect to the amplitude of an input signal (or output signal). Further, components of the distortion characteristic represented by vectors are not lost after being subjected to the quadrature demodulation. Accordingly, by inputting in advance the distortion characteristic as vector values to distortion estimating section 202a, using the distortion characteristic, distortion estimating section 202a is able to estimate the distortion component in the amplified signal 151 obtained in amplifying section 102 (i.e., the distortion component in the baseband signal obtained in quadrature demodulation section 201). Further, distortion compensating section 202b (distortion compensating section 202c) is able to remove the distortion component in the in-phase signal 250b (quadrature signal 250c).

According to such a method, since the distortion characteristic of amplifying section 102 is represented by vectors, distortion correcting section 202 is able to correct the amplitude distortion and phase distortion in the baseband signal obtained in quadrature demodulation section 201. It is thereby possible to reserve the particularly high linearity in the corrected amplified signals, namely, the in-phase signal 452b and quadrature signal 452c, with the distortion corrected in distortion correcting section 202.

According to this embodiment, it is possible to use even an amplifying element having a distortion in a demodulating system requiring the linearity. In particular, under the condition that a distortion is generated in an analog element, it is impossible to expect the effects as designed to an element such as a filter for performing processing on a frequency axis. Accordingly, even using the filter, it is sometimes impossible to prevent the occurrence of an adverse effect such that part of power of information leaks into an adjacent frequency. Therefore, performing the distortion correction as explained in this embodiment has a great effect.

For example, in a communication system where a signal band is broad while a plurality of channels is adjacent, it is necessary to select only a desired frequency signal component to extract. Achieving this processing by a filter comprised of analog elements is extremely difficult in terms of scale and accuracy.

Accordingly, in the convention system, a method is adopted where a filter for selecting a channel is comprised of a digital device. However, the filter comprised of a digital device needs to handle also unnecessary frequency signal components until an analog signal is converted into a digital signal. The problem thereby arises that in terms of the frequency and dynamic range of the amplitude, the linearity should be reserved by the analog element.

According to this embodiment, it is made possible to remove a distortion readily from a received signal by inputting in advance the distortion characteristics of the whole receiving configuration to distortion estimating section 202a, whereby it is possible to make the reception apparatus miniaturized and inexpensive.

In the conventional method, the design on the linearity of elements composing the reception apparatus limits a range of received signals. Accordingly, the linearity of these elements is only maintained when characteristics of a received signal are predicted in advance. According to this embodiment, since the linearity can be maintained in a sufficiently wide range, the reception apparatus is effective particularly in a demodulation system that does not limit received signals in particular (for example, a system with the demodulating section achieved by software).

In the general reception apparatus, since the linear modulation/demodulation is basically adopted, it is preferable to use a linear amplifying element as amplifying section 102. However, all the amplifying elements have the distortion characteristic that the resultant is non-linear with respect to an input signal. The distortion characteristic is often caused by that output signals are saturated, and usually remains constant with respect to the instantaneous power of an input signal. Therefore, an input signal is uniquely determined with respect to the output signal. Accordingly, only using an output signal of amplifying section 102 (namely, the amplified signal 151), distortion correcting section 202 is able to estimate an ideal output signal, in other words, to remove the distortion from the amplified signal 151 from amplifying section 102.

Meanwhile, when an input signal (received signal 150) is not uniquely determined with respect to the output signal of amplifying section 102 (amplified signal 151), distortion correcting section 202 outputs the information on some characteristic (for example, power) of the received signal 150 to distortion correcting section 103 without passing the information through amplifying section 102, whereby it is made possible to remove the distortion from the amplified signal 151. Further, in this case, if the effect is limited, it is possible to estimate an ideal output signal from the output signal (amplified signal 151) of amplifying section 102.

However, in this case, there is a possibility that as a signal from which the distortion is removed, such a signal is obtained that is different from the ideal output signal.

When the distortion characteristic of amplifying section 102 is designed in advance, for example, when the distortion characteristic of amplifying section 102 is designed by an arithmetical calculation, distortion correcting section 202 is readily configured only with the inverse characteristic of amplifying section 102 given thereto, which facilitates the configuration of distortion correcting section 202. Further, if it is possible to measure or design in advance the distortion characteristic of amplifying section 102, it is possible to configure distortion correcting section 202 optimal for removing the distortion characteristic, and furthermore, for example, by representing a change in the distortion characteristic of amplifying section 102 by an arithmetical calculation or storing the change in a reference table, it is possible to configure distortion correcting section 202 with high applicability.

While this embodiment limits a distortion that distortion correcting section 202 corrects to only a distortion generated in amplifying section 102, the distortion that distortion correcting section 202 corrects is not limited in particular. In other words, distortion correcting section 202 is able to perform overall corrections including distortions generated in elements (analog circuits such as a filter element and a mixer element used in frequency conversion) other than amplifying section 102. It is thereby possible to obtain the distortion correction effects with higher accuracy.

While in this embodiment, amplifying section 102 and quantizing section 401 are provided as independent elements, it may be possible to alternate the position of amplifying section 102 and that of quadrature demodulation section 201 to provide amplifying section 102 as an input amplifier for quantizing section 401. In this case, a non-linear quantizing element may be composed of amplifying section 102 and quantizing section 401.

Distortion correcting section 202 handles a quantized baseband signal from quantizing section 401, i.e., handles quantization information. Accordingly, distortion correcting section 202 is capable of being composed of a conventional logical circuit, or of being achieved by the software (computer program).

As described above, in this embodiment, the distortion correction is performed to received signals with distortions caused by reception processing, using the inverse characteristic of an analog element that executes the reception processing. The linearity is thereby maintained in the reception-processing processed received signals to be used in demodulation processing. Accordingly, the excellent characteristics are maintained in demodulated signals obtained by demodulating the reception-processing processed received signals. Further, in this embodiment, since the distortion correction is performed to the baseband signal obtained by the quadrature demodulation, it is possible to remove both the amplitude distortion and phase distortion in the received signals to be input to the demodulating section. In addition to the foregoing, in this embodiment, received signals with distortions caused by the reception processing are converted into digital signals, and the distortion correction is performed to the digital received signals. In other words, the received signals are processed as digital signals when the distortion correction is performed thereto. The digital reception apparatus according to the present invention is thereby capable of obtaining the characteristics with high accuracy and with stability.

Sixth Embodiment

Figure 6:
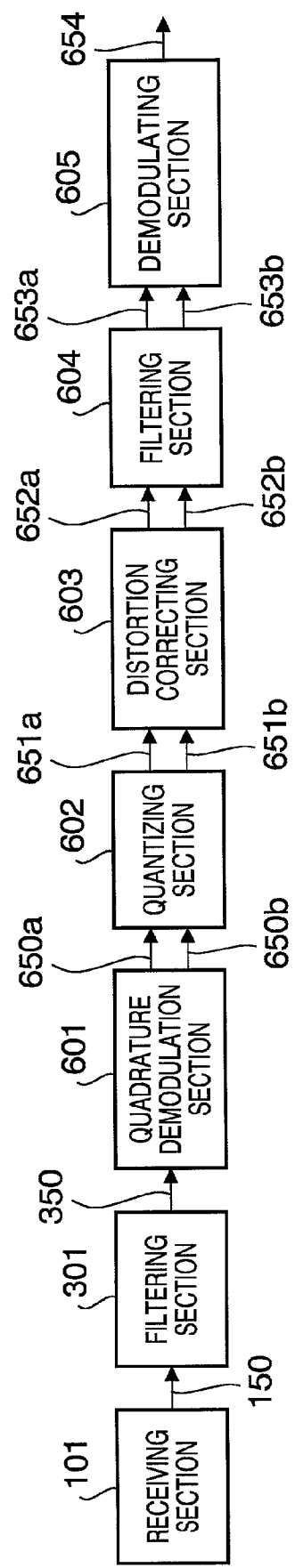
FIG. 6 is a block diagram illustrating a configuration of a digital reception apparatus according to a sixth embodiment of the present invention.

FIG. 6 is a block diagram illustrating a configuration of a digital reception apparatus according to the sixth embodiment of the present invention. In addition, in FIG. 6, the same sections as in the third embodiment (FIG. 3) are assigned the same reference numerals as in FIG. 3, and the detailed explanations are omitted.

The digital reception apparatus according to this embodiment is provided with receiving section 101, filtering section 301, quadrature demodulation section 601, quantizing section 602, distortion correcting section 603, filtering section 604, and demodulating section 605.

The operation of the digital reception apparatus with the above configuration is explained with attention only given to points different from the third embodiment.

The band limited signal 350 obtained in filtering section 301 is demodulated in quadrature demodulation section 601 to be a baseband signal including an in-phase signal 650a and quadrature signal 650b. The obtained in-phase signal 650a and quadrature signal 650b in the baseband signal are output to quantizing section 602.

Quantizing section 602 performs quantization (i.e., non-linear quantization) on the in-phase signal 650a (quadrature signal 650b) in the baseband signal, while changing a quantization step corresponding to the amplitude of in-phase signal 650a (quadrature signal 650b) in the baseband signal input thereto. An in-phase signal 651a (quadrature signal 651b) in a non-linear quantized signal is thereby obtained. In addition, the non-linear quantization will be described specifically later. The obtained in-phase signal 651a (quadrature signal 651b) in the non-linear quantized signal is output to distortion correcting section 603.

Distortion correcting section 603 has information on the relationship between an input signal and output signal in quantizating section 602 input beforehand thereto. Using the information, distortion correcting section 603 linearizes the in-phase signal 651a and quadrature signal 651b in the non-linear quantized signal. An in-phase signal 652a and quadrature signal 652b in a corrected baseband signal are thereby obtained. Filtering section 604 limits the frequency bands of the obtained in-phase signal 652a and quadrature signal 652b in the corrected baseband signal. An in-phase signal 653a and quadrature signal 653b in a band limited baseband signal are thereby obtained. The obtained in-phase signal 653a and quadrature signal 653b in the band limited baseband signal are demodulated in demodulating section 605. A demodulated signal 654 is thereby obtained.

Quantizing section 602 has the distortion characteristic that remains constant with respect to the amplitude of an input signal (or output signal). By inputting in advance the distortion characteristic to distortion correcting section 603, using the distortion characteristic, distortion correcting section 603 is able to linearize the non-linear quantized signal obtained in quantizing section 602. Further, the non-linear quantized signal is processed as a digital signal when the distortion correction is performed thereto. The digital reception apparatus according to this embodiment is thereby capable of obtaining the characteristics with high accuracy and with stability.

In the conventional quantization, the whole range of the amplitude available for received signals to be quantized is divided into a plurality of quantization steps each with a constant signal width, and each quantization step is assigned a code specific to the quantization step. This processing equals dispersing a quantization error over all the signals with equal levels. Then, the whole range of the amplitude available for received signals to be quantized is divided into a plurality of quantization steps with mutually different signal widths, and each quantization step is subjected to demodulation specific to the quantization step, whereby the quantization error changes, and thereby can be adjusted corresponding to the amplitude of the signal.

Using the above processing enables the adjustment of a noise to be provided to the digital reception apparatus. The reception characteristics of the digital reception apparatus are determined by a system noise represented by noise index, quantization error, calculation error, etc. The system noise remains almost constant regardless of received level, and the effect of the calculation error tends to decrease as the amplitude of a signal to be processed increases.

Therefore, for example, by making the sum of the quantization error and calculation error constant, or by sacrificing the characteristic at a high C/N environment, it is possible to increase the quantization error as the amplitude of a signal increases. Specifically, the quantizing section assigns a quantization step with a small signal width to a received signal with the small amplitude, while assigning a quantization step with a large signal width to a received signal with the large amplitude. The quantization noise caused by the quantization error is thereby weighted largely on the received signal with the large amplitude, whereby it is possible to make the sum of the quantization error and calculation error constant.

Using such non-linear quantization, it is possible to expand the whole range of the amplitude of received signals to be quantized without increasing the quantization number (resolution). Further, by adjusting quantization steps to be optimal, it is possible to achieve the quantization with the small quantization number. In particular, by designing the quantization steps corresponding to a modulation scheme used in communications and an expected reception environment, it is possible to design a digital reception apparatus that performs highly efficient reception.

Further, distortion correcting section 603 performs the processing using the vector calculation, whereby it is possible to correct the amplitude distortion and phase distortion generated in receiving section 101.

According to this embodiment, it is possible to use even an amplifying element having a distortion in a demodulating system requiring the linearity. In particular, under the condition that a distortion is generated in an analog element, it is impossible to expect the effects as designed to an element such as a filter for performing processing on a frequency axis. Accordingly, even using the filter, it is sometimes impossible to prevent the occurrence of an adverse effect such that part of power of information leaks into an adjacent frequency. Therefore, performing the distortion correction as explained in this embodiment has a great effect.

For example, in a communication system where a signal band is broad while a plurality of channels is adjacent, it is necessary to select only a desired frequency signal component to extract. Achieving this processing by a filter comprised of analog elements is extremely difficult in terms of scale and accuracy.

Accordingly, in the convention system, a method is adopted where a filter for selecting a channel is comprised of a digital device. However, the filter comprised of a digital device needs to handle also unnecessary frequency signal components until an analog signal is converted into a digital signal. The problem thereby arises that in terms of the frequency and dynamic range of the amplitude, the linearity should be reserved by the analog element.

According to this embodiment, it is made possible to remove a distortion readily from a received signal by inputting in advance the distortion characteristics of quantizing section 602 and the whole receiving configuration to distortion estimating section 602, whereby it is possible to expand a range of the amplitude of manageable signals, and to make the reception apparatus miniaturized and inexpensive.

When a signal with large power transmitted on an adjacent channel is input as an interfering signal to the digital reception apparatus according to this embodiment, it is necessary to set a range of quantization in quantizing section 602 to be large. However, under the condition that the resolution is the same in the quantization, the quantization errors are increased, and the characteristic of a demodulated signal deteriorates. Then, it is made possible to perform non-linear quantization in quantizing section 602, and to perform the distortion correction corresponding to the non-linear quantization in distortion correcting section 603. It is thereby possible to provide a weight of the quantization error from a signal with low power to a signal with high power, and therefore even under the condition of the same quantization resolution, the characteristic of a demodulated signal does not deteriorate in particular.

In the conventional method, the design on the linearity of elements composing the reception apparatus limits a range of received signals. Accordingly, the linearity of these elements is only maintained when characteristics of a received signal are predicted in advance. According to this embodiment, since the linearity can be maintained in a sufficiently wide range, the reception apparatus is effective particularly in a demodulation system that does not limit received signals in particular (for example, a system with the demodulating section achieved by software).

In the general reception apparatus, since the linear modulation/demodulation is basically adopted, a linear amplifying element is used as receiving section 101. However, all the amplifying elements have the distortion characteristic that the resultant is non-linear with respect to an input signal. The distortion characteristic is often caused by that output signals are saturated, and usually remains constant with respect to the instantaneous power of an input signal. Therefore, an input signal is uniquely determined with respect to the output signal. Accordingly, only using an output signal of receiving section 101 (i.e., the received signal 150), distortion correcting section 603 is able to estimate an ideal output signal, in other words, to remove the distortion from the received signal 150 from receiving section 101.

Meanwhile, when an input signal is not uniquely determined with respect to the output signal (received signal 150) of receiving section 101, distortion correcting section 603 outputs the information on some characteristic (for example, power) of the received signal 150 to distortion correcting section 630, whereby it is made possible to remove the distortion from the received signal 150. Further, in this case, if the effect is limited, it is possible to estimate an ideal output signal from the output signal (received signal 150) of receiving section 101. However, in this case, there is a possibility that as a signal from which the distortion is removed, such a signal is obtained that is different from the ideal output signal.

When the distortion characteristic of quantizing section 602 is designed in advance, for example, when the distortion characteristic is designed by an arithmetical calculation, distortion correcting section 603 is readily configured only with the inverse characteristic of the distortion characteristic given thereto, which facilitates the configuration of distortion correcting section 603. Further, if it is possible to measure or design in advance the distortion characteristic of quantizing section 602, it is possible to configure distortion correcting section 603 optimal for removing the distortion characteristic, and furthermore, for example, by representing a change in the distortion characteristic of quantizing section 602 by an arithmetical calculation or storing the change in a reference table, it is possible to configure distortion correcting section 603 with high applicability.

While this embodiment limits a distortion that distortion correcting section 603 corrects to only a distortion generated in quantizing section 602, the distortion that distortion correcting section 603 corrects is not limited in particular. Distortion correcting section 603 may perform overall corrections including distortions generated in elements such as receiving section 101 besides the distortion caused by quantizing section 602, whereby it is obvious that the distortion correction effects with high accuracy can be obtained.

Distortion correcting section 303 handles quantization information, and therefore is capable of being composed of a conventional logical circuit, or of being achieved by the software (computer program).

Seventh Embodiment

Figure 7:
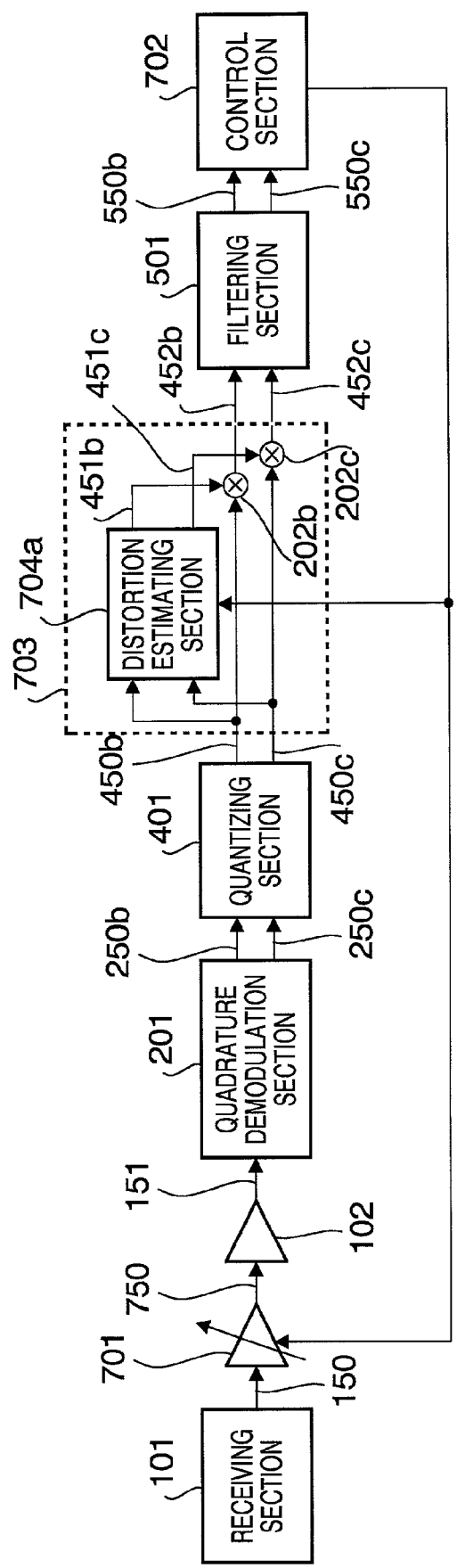
FIG. 7 is a block diagram illustrating a configuration of a digital reception apparatus according to a seventh embodiment of the present invention.

FIG. 7 is a block diagram illustrating a configuration of a digital reception apparatus according to the seventh embodiment of the present invention. In addition, in FIG. 7, the same sections as in the fifth embodiment (FIG. 5) are assigned the same reference numerals as in FIG. 5, and the detailed explanations are omitted.

The digital reception apparatus according to this embodiment is provided with receiving section 101, gain adjusting section 701, amplifying section 102, quadrature demodulation section 201, quantizing section 401, distortion correcting section 703 having distortion estimating section 704a and distortion compensating sections 202b and 202c, filtering section 501, and control section 702.

The operation of the digital reception apparatus with the above configuration is explained with attention only given to points different from the fifth embodiment.

The received signal 150 from receiving section 101 is subjected to amplitude adjustment in gain adjusting section 701. Gain adjusting section 701 thereby outputs a gain adjusted signal 750 to amplifying section 102. In addition, gain adjusting section 701 performs the amplitude adjustment based on a gain control signal 751 from control section 702. The gain control signal 751 will be described specifically later.

The gain adjusted signal 750 is amplified in amplifying section 102, and then output to quadrature demodulation section 201. The processing performed in from quadrature demodulation section 201 to filtering section 501 is the same as in the fifth embodiment, and the detailed explanations are omitted. The in-phase signal 550b and quadrature signal 550c in the band limited baseband signal obtained in filtering section 501 are output to control section 702.

Signal components necessary for the demodulation are only input to control section 702 from among the in-phase signal 250b and quadrature signal 250c in the baseband signal obtained in quadrature demodulation section 201. In other words, the in-phase signal 550b and quadrature signal 550c in the band limited baseband signal correspond to the signal components necessary for the demodulation (specifically, the signal obtained by removing from a received signal a signal corresponding to a channel used by another communication apparatus other than the digital reception apparatus). The aforementioned signal components necessary for the demodulation are equal to signal components corresponding to a desired signal contained in the received signal.

Accordingly, if the amplitude is controlled in gain adjusting section 701 based on the amplitude of in-phase signal 550b and quadrature signal 550c in the band limited baseband signal obtained in filtering section 501, it is possible to expand a dynamic range of each of the in-phase signal 550b and quadrature signal 550c in the band limited baseband signal. That is, it is possible to perform the gain control on the amplitude of a desired signal. It is thereby possible to prevent the reception characteristic from deteriorating.

Specifically, in order to bring the amplitude of the in-phase signal 550b and quadrature signal 550c in the band limited baseband signal close to a predetermined required value, control section 702 generates a suppressing signal for suppressing the gain in gain adjusting section 701 when the amplitude of the in-phase signal 550b and quadrature signal 550c is more than the required value, while generating an increasing signal for increasing the gain in gain adjusting section 701 when the amplitude of the in-phase signal 550b and quadrature signal 550c is less than the required value. The thus generated suppressing signal or increasing signal is output to gain adjusting section 701 as the gain control signal 751.

Meanwhile, in the conventional system, when an interfering signal with an excessive level is received, a method is adopted that suppresses the whole level of the received signal so as not to generate a distortion in the receiving configuration. In this method, with the received signal level suppressed, the amplitude of the desired signal contained in the received signal is also suppressed, and therefore the reception characteristic deteriorates.

Control section 702 outputs the gain control signal 751 also to distortion estimating section 704a in distortion correcting section 703. Distortion estimating section 704a also refers to the gain control signal 751 when the section 704a estimates distortions contained in the in-phase signal 450b and quadrature signal 450c in the quantized baseband signal.

In addition, it is naturally possible for control section 702 to perform the gain control with higher accuracy by monitoring the amplitude of an interfering signal and received signal, as well as the desired signal. Control section 702 further performs the gain control including the amplitude of signals necessary for the demodulation in the demodulating section, whereby it is possible to, for example, monitor an effect due to a distortion. It is thereby possible to perform the gain control with higher accuracy.

Since amplifying section 102 has the distortion characteristic that remains constant with respect to the amplitude of an input signal (or output signal), gain adjusting section 701 that controls the amplitude of the gain adjusted signal 750 to be input to amplifying section 102 is able to control the distortion characteristic of amplifying section 102. Components of the distortion characteristic of amplifying section 102 represented by vectors are not lost after being subjected to the quadrature demodulation in quadrature demodulation section 201. By inputting in advance the characteristic of amplifying section 102 to distortion estimating section 704a, distortion estimating section 704a is able to estimate the distortion components caused by amplifying section 102, and distortion compensating sections 202b and 202c are able to remove the distortion components caused by amplifying section 102. According to such a method, since the distortion characteristic is represented by vectors, the distortion correcting section is able to correct the amplitude distortion and phase distortion. It is thereby possible to reserve the particularly high linearity.

Further, the received signals are processed as digital signals when the distortion correction is performed thereto. The digital reception apparatus according to this embodiment is thereby capable of obtaining the characteristics with high accuracy and with stability.

According to this embodiment, it is possible to use even an amplifying element having a distortion in a demodulating system requiring the linearity. In particular, under the condition that a distortion is generated in an analog element, it is impossible to expect the effects as designed to an element such as a filter for performing processing on a frequency axis. Accordingly, even using the filter, it is sometimes impossible to prevent the occurrence of an adverse effect such that part of power of information leaks into an adjacent frequency. Therefore, performing the distortion correction as explained in this embodiment has a great effect.

For example, in a communication system where a signal band is broad while a plurality of channels is adjacent, it is necessary to select only a desired frequency signal component to extract. Achieving this processing by a filter comprised of analog elements is extremely difficult in terms of scale and accuracy.

Accordingly, in the convention system, a method is adopted where a filter for selecting a channel is comprised of a digital device. However, the filter comprised of a digital device needs to handle also unnecessary frequency signal components until an analog signal is converted into a digital signal. The problem thereby arises that in terms of the frequency and dynamic range of the amplitude, the linearity should be reserved by the analog element.

According to this embodiment, it is made possible to remove a distortion readily from a received signal by inputting in advance the distortion characteristics of the whole receiving configuration to distortion estimating section 704a, whereby it is possible to expand a range of the amplitude of manageable signals, and to make the reception apparatus miniaturized and inexpensive.

When a signal with large power transmitted on an adjacent channel is input as an interfering signal to the digital reception apparatus according to this embodiment, it is necessary to set a range of quantization in quantizing section 401 to be large. However, under the condition that the resolution is the same in the quantization, the quantization errors are increased, and the characteristic of a demodulated signal deteriorates. Then, it is possible to provide a distortion characteristic for limiting the amplitude to the amplified signal in the amplifying section disposed at a first half, and to perform the distortion correction corresponding to the distortion characteristic in distortion correcting section at a latter half. It is thereby possible to provide a weight of the quantization error from a signal with low power to a signal with high power, and therefore even under the condition of the same quantization resolution, the characteristic of a demodulated signal does not deteriorate in particular.

In the conventional method, the design on the linearity of elements composing the reception apparatus limits a range of received signals. Accordingly, the linearity of these elements is only maintained when characteristics of a received signal are predicted in advance. According to this embodiment, since the linearity can be maintained in a sufficiently wide range, the reception apparatus is effective particularly in a demodulation system that does not limit received signals in particular (for example, a system with the demodulating section achieved by software).

In the general reception apparatus, since the linear modulation/demodulation is basically adopted, a linear amplifying element is used as amplifying section 102. However, all the amplifying elements have the distortion characteristic that the resultant is non-linear with respect to an input signal. The distortion characteristic is often caused by that output signals are saturated, and usually remains constant with respect to the instantaneous power of an input signal. Therefore, an input signal is uniquely determined with respect to the output signal. Accordingly, only using an output signal of amplifying section 102 (i.e., the amplified signal 151), distortion correcting section 703 is able to estimate an ideal output signal, in other words, to remove the distortion from the amplified signal 151 from amplifying section 102.

Meanwhile, when an input signal (gain adjusted signal 750) is not uniquely determined with respect to the output signal (amplified signal 151) of amplifying section 102, distortion correcting section 703 outputs the information on some characteristic (for example, power) of the gain adjusted signal 750 to distortion correcting section 730 without passing the information through amplifying section 102, whereby it is made possible to remove the distortion from the received signal 150. Further, in this case, if the effect is limited, it is possible to estimate an ideal output signal from the output signal (amplified signal 151) of amplifying section 102. However, in this case, there is a possibility that as a signal from which the distortion is removed, such a signal is obtained that is different from the ideal output signal.

When the distortion characteristic of amplifying section 102 is designed in advance, for example, when the distortion characteristic is designed by an arithmetical calculation, distortion correcting section 703 is readily configured only with the inverse characteristic of the distortion characteristic given thereto, which facilitates the configuration of distortion correcting section 703. Further, if it is possible to measure or design in advance the distortion characteristic of amplifying section 102, it is possible to configure distortion correcting section 703 optimal for removing the distortion characteristic, and furthermore, for example, by representing a change in the distortion characteristic of amplifying section 102 by an arithmetical calculation or storing the change in a reference table, it is possible to configure distortion correcting section 703 with high applicability.

While this embodiment limits a distortion that distortion correcting section 703 corrects to only a distortion generated in amplifying section 102, the distortion that distortion correcting section 703 corrects is not limited in particular. Distortion correcting section 703 may perform overall corrections including distortions generated in elements such as receiving section 101 besides the distortion caused by amplifying section 102, whereby it is obvious that the distortion correction effects with high accuracy can be obtained.

While in this embodiment, amplifying section 102 and quantizing section 401 are provided as independent elements, it may be possible to alternate the position of amplifying section 102 and that of quadrature demodulation section 201 to provide amplifying section 102 as an input amplifier for quantizing section 401. In this case, a non-linear quantizing element may be composed of amplifying section 102 and quantizing section 401.

Eighth Embodiment

Figure 8:
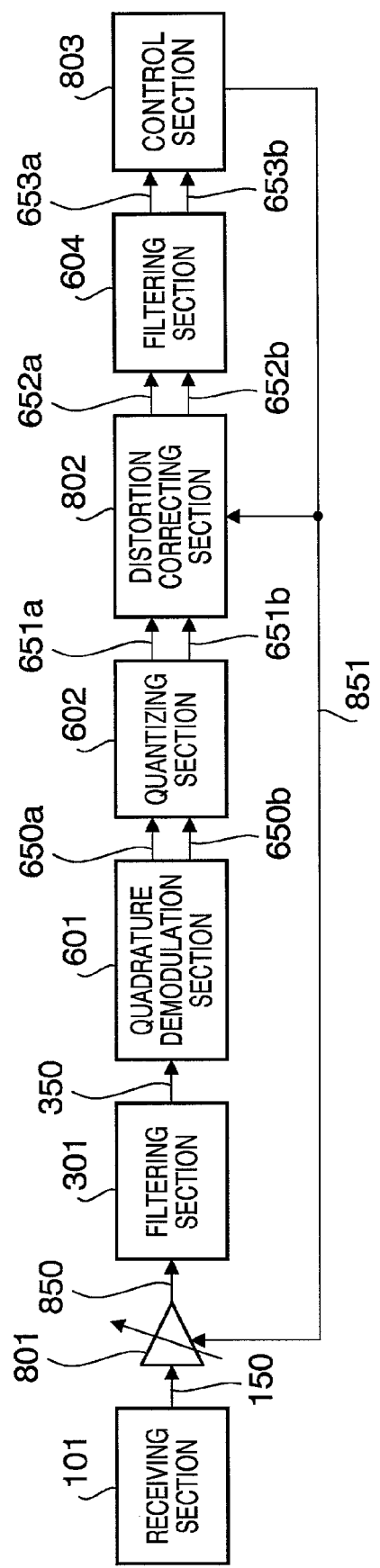
FIG. 8 is a block diagram illustrating a configuration of a digital reception apparatus according to an eighth embodiment of the present invention.

FIG. 8 is a block diagram illustrating a configuration of a digital reception apparatus according to the eighth embodiment of the present invention. In addition, in FIG. 8, the same sections as in the sixth embodiment (FIG. 6) are assigned the same reference numerals as in FIG. 6, and the detailed explanations are omitted.

The digital reception apparatus according to this embodiment is provided with receiving section 101, gain adjusting section 801, filtering section 301, quadrature demodulation section 601, quantizing section 602, distortion correcting section 802, filtering section 604, and control section 803.

The operation of the digital reception apparatus with the above configuration is explained with attention only given to points different from the sixth embodiment.

The received signal 150 from receiving section 101 is subjected to amplitude adjustment in gain adjusting section 801. Gain adjusting section 801 thereby outputs a gain adjusted signal 850 to filtering section 301. In addition, gain adjusting section 801 performs the amplitude adjustment based on a gain control signal 851 from control section 803. The gain control signal 851 will be described specifically later.

The gain adjusted signal 850 is subjected to band limitation in filtering section 301, and then output to quadrature demodulation section 201. The processing performed in from quadrature demodulation section 601 to filtering section 604 is the same as in the sixth embodiment, and the detailed explanations are omitted. An in-phase signal 653$b$ and quadrature signal 653$c$ in the band limited baseband signal obtained in filtering section 604 are output to control section 803.

Signal components necessary for the demodulation are only input to control section 803 from among the in-phase signal 650$a$ and quadrature signal 650$b$ in the baseband signal obtained in quadrature demodulation section 601. In other words, the in-phase signal 653$a$ and quadrature signal 653$b$ in the band limited baseband signal correspond to the signal components necessary for the demodulation (specifically, the signal obtained by removing from a received signal a signal corresponding to a channel used by another communication apparatus other than the digital reception apparatus).

Accordingly, if the amplitude is controlled in gain adjusting section 801 based on the amplitude of the in-phase signal 653$a$ and quadrature signal 653$b$ in the band limited baseband signal obtained in filtering section 604, it is possible to expand a dynamic range of each of the in-phase signal 653$a$ and quadrature signal 653$b$ in the band limited baseband signal. That is, it is possible to perform the gain adjustment on the amplitude of a desired signal. It is thereby possible to prevent the reception characteristic from deteriorating.

Specifically, in order to bring the amplitude of in-phase signal 653$a$ and quadrature signal 653$b$ in the band limited baseband signal close to a predetermined required value, control section 803 generates a suppressing signal for suppressing the gain in gain adjusting section 801 when the amplitude of the in-phase signal 653$a$ and quadrature signal 653$b$ is more than the required value, while generating an increasing signal for increasing the gain in gain adjusting section 801 when the amplitude of the in-phase signal 653$a$ and quadrature signal 653$b$ is less than the required value. The thus generated suppressing signal or increasing signal is output to gain adjusting section 801 as the gain control signal 851.

Meanwhile, in the conventional system, when an interfering signal with an excessive level is received, a method is adopted that suppresses the whole level of the received signal so as not to generate a distortion in the receiving configuration. In this method, with the received signal level suppressed, the amplitude of the desired signal contained in the received signal is also suppressed, and therefore the reception characteristic deteriorates.

Control section 803 outputs the gain control signal 851 also to distortion correcting section 802. Distortion correcting section 802 also refers to the gain control signal 851 when the section 802 linearizes the in-phase signal 650$a$ and quadrature signal 650$b$ in the non-linear quantized signal.

In addition, it is naturally possible for control section 803 to perform the gain control with higher accuracy by monitoring the amplitude of an interfering signal and received signal, as well as the desired signal. Control section 803 further performs the gain control including the amplitude of signals necessary for the demodulation in the demodulating section, whereby it is possible to, for example, monitor an effect due to a distortion. It is thereby possible to perform the gain control with higher accuracy.

Quantizing section 602 has the distortion characteristic that remains constant with respect to the amplitude of an input signal (or output signal). By inputting in advance the distortion characteristic to distortion correcting section 802, using the distortion characteristic, distortion correcting section 802 is able to linearize the non-linear quantized signal obtained in quantizing section 602. Further, the non-linear quantized signal is processed as a digital signal when the distortion correction is performed thereto. The digital reception apparatus according to this embodiment is thereby capable of obtaining the characteristics with high accuracy and with stability.

In the conventional quantization, the whole range of the amplitude available for received signals to be quantized is divided into a plurality of quantization steps each with a constant signal width, and each quantization step is assigned a code specific to the quantization step. This processing equals dispersing a quantization error over all the signals with equal levels. Then, the whole range of the amplitude available for received signals to be quantized is divided into a plurality of quantization steps with mutually different signal widths, and each quantization step is subjected to demodulation specific to the quantization step, whereby the quantization error changes, and therefore can be adjusted corresponding to the amplitude of the signal.

Using the above processing enables the adjustment of a noise to be provided to the digital reception apparatus. The reception characteristics of the digital reception apparatus are determined by a system noise represented by noise index, quantization error, calculation error, etc. The system noise remains almost constant regardless of received level, and the effect of the calculation error tends to decrease as the amplitude of a signal to be processed increases.

Therefore, for example, by making the sum of the quantization error and calculation error constant, or by sacrificing the characteristic at a high C/N environment, it is possible to increase the quantization error as the amplitude of a signal increases. Specifically, the quantizing section assigns a quantization step with a small signal width to a received signal with the small amplitude, while assigning a quantization step with a large signal width to a received signal with the large amplitude. The quantization noise caused by the quantization error is thereby weighted largely on the received signal with the large amplitude, whereby it is possible to make the sum of the quantization error and calculation error constant.

Using such non-linear quantization, it is possible to expand the whole range of the amplitude of received signals to be quantized without increasing the quantization number (resolution). Further, by adjusting quantization steps to be optimal, it is possible to achieve the quantization with the small quantization number. In particular, by designing the quantization steps corresponding to a modulation scheme used in communications and an expected reception environment, it is possible to design a digital reception apparatus that performs highly efficient reception.

Distortion correcting section 802 performs the processing using the vector calculation, whereby it is possible to correct the amplitude distortion and phase distortion generated in receiving section 101.

According to this embodiment, it is possible to use even an amplifying element having a distortion in a demodulating system requiring the linearity. In particular, under the condition that a distortion is generated in an analog element, it is impossible to expect the effects as designed to an element such as a filter for performing processing on a frequency axis. Accordingly, even using the filter, it is sometimes impossible to prevent the occurrence of an adverse effect such that part of power of information leaks into an adjacent frequency. Therefore, performing the distortion correction as explained in this embodiment has a great effect.

For example, in a communication system where a signal band is broad while a plurality of channels is adjacent, it is necessary to select only a desired frequency signal component to extract. Achieving this processing by a filter comprised of analog elements is extremely difficult in terms of scale and accuracy.

Accordingly, in the convention system, a method is adopted where a filter for selecting a channel is comprised of a digital device. However, the filter comprised of a digital device needs to handle also unnecessary frequency signal components until an analog signal is converted into a digital signal. The problem thereby arises that in terms of the frequency and dynamic range of the amplitude, the linearity should be reserved by the analog element.

According to this embodiment, it is made possible to remove a distortion readily from a received signal by inputting in advance the distortion characteristics of quantizing section 602 and the whole receiving configuration to distortion correcting section 802, whereby it is possible to make the reception apparatus miniaturized and inexpensive.

When a signal with large power transmitted on an adjacent channel is input as an interfering signal to the digital reception apparatus according to this embodiment, it is necessary to set a range of quantization in quantizing section 602 to be large. However, under the condition that the resolution is the same in the quantization, the quantization errors are increased, and the characteristic of a demodulated signal deteriorates. Then, it is made possible to perform non-linear quantization in quantizing section 602, and to perform the distortion correction corresponding to the non-linear quantization in distortion correcting section 802. It is thereby possible to provide a weight of the quantization error from a signal with low power to a signal with high power, and therefore even under the condition of the same quantization resolution, the characteristic of a demodulated signal does not deteriorate in particular.

In the conventional method, the design on the linearity of elements composing the reception apparatus limits a range of received signals. Accordingly, the linearity of these elements is only maintained when characteristics of a received signal are predicted in advance. According to this embodiment, since the linearity can be maintained in a sufficiently wide range, the reception apparatus is effective particularly in a demodulation system that does not limit received signals in particular (for example, a system with the demodulating section achieved by software).

In the general reception apparatus, since the linear modulation/demodulation is basically adopted, linear amplifying elements are used as receiving section 101 and gain adjusting section 801. However, all the amplifying elements have the distortion characteristic that the resultant is non-linear with respect to an input signal. The distortion characteristic is often caused by that output signals are saturated, and usually remains constant with respect to the instantaneous power of an input signal. Therefore, an input signal is uniquely determined with respect to the output signal. Accordingly, only using an output signal of receiving section 101 (i.e., the received signal 150) and an output signal of gain adjusting section 801 (i.e., gain adjusted signal 850), distortion correcting section 802 is able to estimate an ideal output signal, in other words, to remove the distortion from the received signal 150 from receiving section 101.

Meanwhile, when respective input signal are not uniquely determined with respect to the output signal (received signal 150) of receiving section 101 and the output signal (gain adjusted signal 850) of gain adjusting section 801, distortion correcting section 802 outputs the information on some characteristics (for example, power) of the output signal of receiving section 101 (i.e., the received signal 150) and the output signal of gain adjusting section 801 (i.e., gain adjusted signal 850) to distortion correcting section 802, whereby it is made possible to remove the distortion. Further, in this case, if the effect is limited, it is possible to estimate an ideal output signal from the output signal of receiving section 101 (the received signal 150) and the output signal of gain adjusting section 801 (gain adjusted signal 850). However, in this case, there is a possibility that as a signal from which the distortion is removed, such a signal is obtained that is different from the ideal output signal.

When the distortion characteristic of quantizing section 602 is designed in advance, for example, when the distortion characteristic is designed by an arithmetical calculation, distortion correcting section 802 is readily configured only with the inverse characteristic of the distortion characteristic given thereto, which facilitates the configuration of distortion correcting section 802. Further, if it is possible to measure or design in advance the distortion characteristic of quantizing section 602, it is possible to configure distortion correcting section 802 optimal for removing the distortion characteristic, and furthermore, for example, by representing a change in the distortion characteristic of quantizing section 602 by an arithmetical calculation or storing the change in a reference table, it is possible to configure distortion correcting section 802 with high applicability.

While this embodiment limits a distortion that distortion correcting section 802 corrects to only a distortion generated in quantizing section 602, the distortion that distortion correcting section 802 corrects is not limited in particular. Distortion correcting section 802 may perform overall corrections including distortions generated in elements such as receiving section 101 besides the distortion caused by quantizing section 602, whereby it is obvious that the distortion correction effects with high accuracy can be obtained.

Distortion correcting section 802 handles quantization information, and therefore is capable of being composed of a conventional logical circuit, or of being achieved by the software (computer program).

Ninth Embodiment

Figure 9:
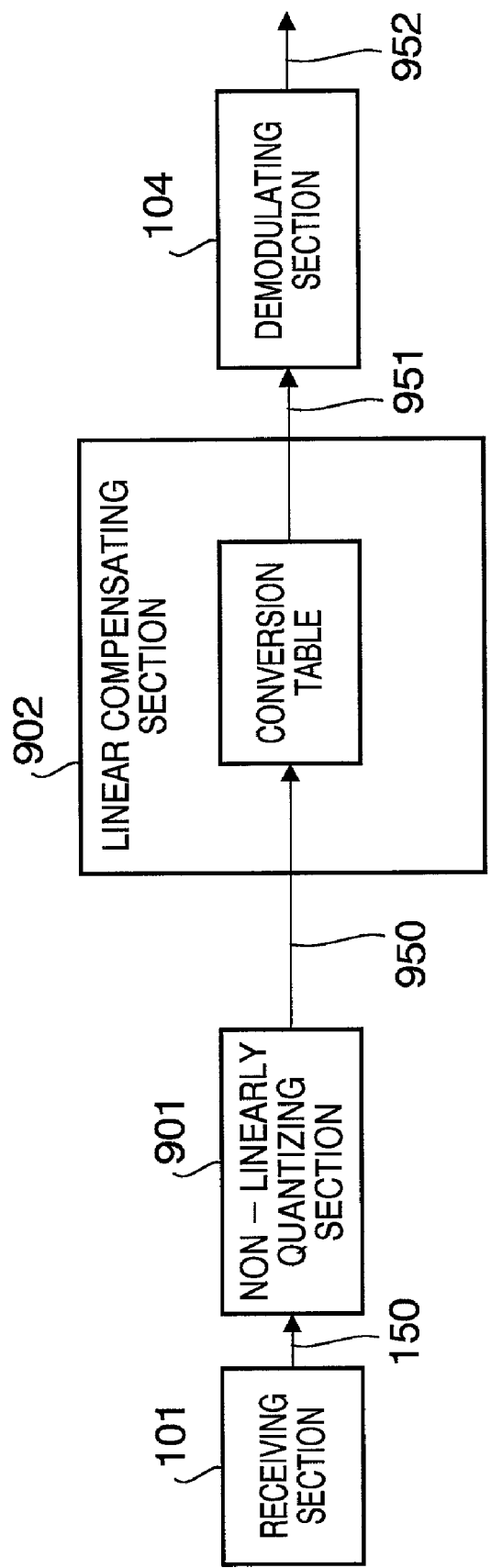
FIG. 9 is a block diagram illustrating a configuration of a digital reception apparatus according to a ninth embodiment of the present invention.

FIG. 9 is a block diagram illustrating a configuration of a digital reception apparatus according to the ninth embodiment of the present invention. In addition, in FIG. 9, the same sections as in the first embodiment (FIG. 1) are assigned the same reference numerals as in FIG. 1, and the detailed explanations are omitted.

The digital reception apparatus according to this embodiment is provided with receiving section 101, non-linearly quantizing section 901, linearly compensating section 902, and demodulating section 104.

The operation of the digital reception apparatus with the above configuration is explained.

The received signal from receiving section 101 is coded in non-linearly quantizing section 901 to be a non-linear quantized coded signal 950. At this point, the quantization characteristics in non-linearly quantizing section 901 are predetermined in accordance with the characteristics of signals to be quantized.

Figure 10B:
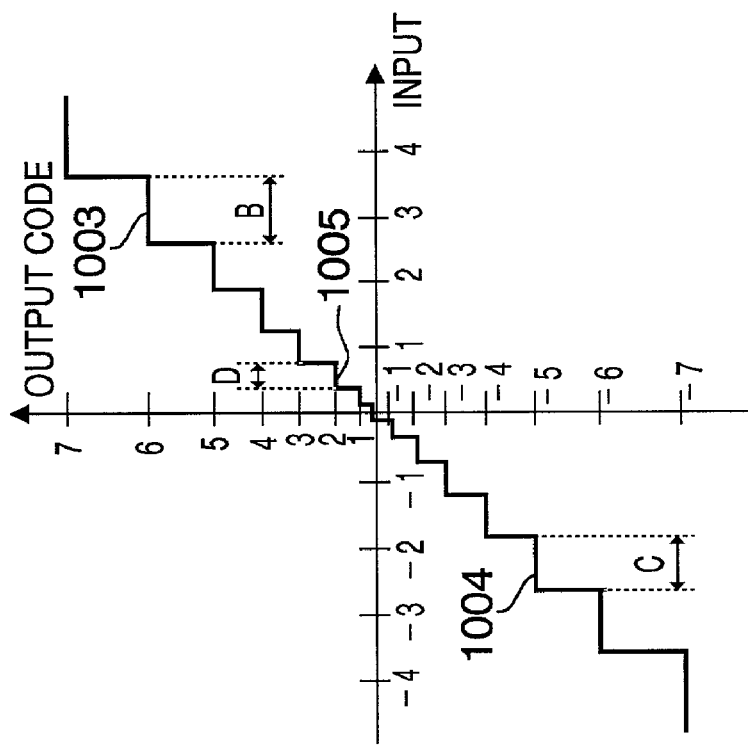
FIG. 10B is a schematic view showing an example of the relationship between an input signal and output code in non-linear quantization in the digital reception apparatus according to the ninth embodiment of the present invention.
Figure 10A:
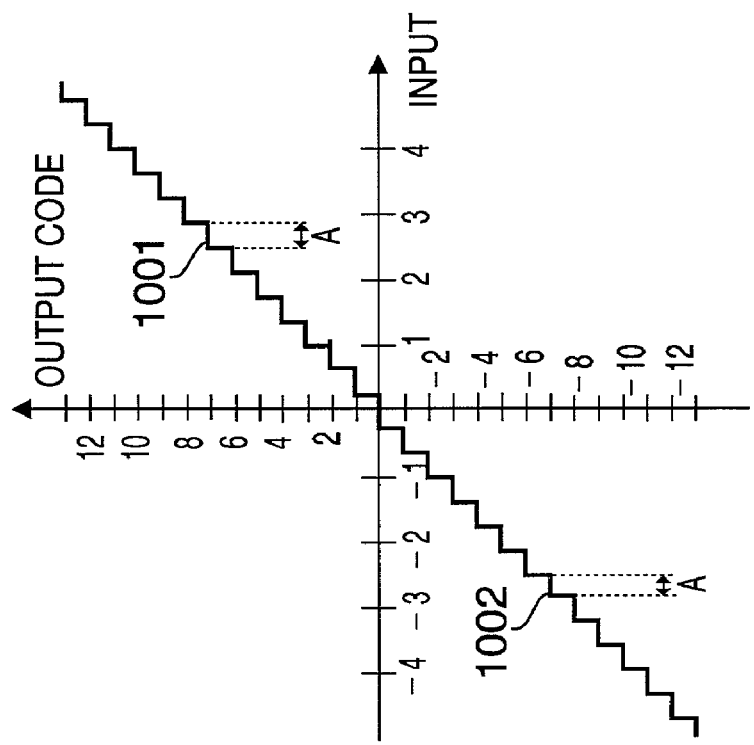
FIG. 10A is a schematic view showing an example of the relationship between an input signal and output code in conventional linear quantization.

Herein, the details of the non-linear quantization performed by non-linearly quantizing section 901 is explained with reference to FIGS. 10A and 10B. FIG. 10A is a schematic view showing an example of the relationship between an input signal and output code in the convention linear quantization. FIG. 10B is a schematic view showing an example of the relationship between an input signal and output code in the non-linear quantization in the digital reception apparatus according to the ninth embodiment of the present invention.

A code c that is output by performing the linear quantization with a resolution N on a signal s is defined as indicated by the following equation (1):

$$c=Q(s,N)-(1)$$

FIG. 10A shown the relationship between the input signal s and the quantized code in performing the linear quantization according to the equation (1).

Specifically, the whole range of the amplitude (approximately −5 to +5 in FIG. 10A) available for signals (received signals) to be quantized is divided into a plurality of quantization steps each with a constant signal width (the signal width A in FIG. 10A), and each quantization step is assigned an output code specific to the quantization step. For example, a quantization step 1001 with the signal width A is assigned an output code 7 specific to the quantization step 1001, while a quantization step 1002 with the signal A is assigned an output code −7 specific to the quantization step 1002.

Meanwhile, the non-linear quantization is defined as performing the linear-quantization on a non-linear signal s' obtained by subjecting the signal s to the non-linear processing f(x). A code c' output by the non-quantization is defined by the equation (2) shown below:

$$c'=Q(s',N)-(2)$$

Herein, it is assumed that the non-linear processing f( ) is determined by the characteristics of signals to be quantized. As an example, the non-linear processing f( ) is defined by the equation (3) shown below, using the appearance probability distribution p of the signal amplitude:

$$S'=f(s,p)-(3)$$

Further, assuming the inverse function of the non-linear processing f( ) is F( ) the following equation (4) is obtained:

$$s=F(s',p)-(4)$$

The non-linear processing function f( ) is a function such that s and s' are in unique relation to each other in the equations (3) and (4).

At this point, the linearity corresponds to satisfying the following equation (5):

$$s(x+y)=g(x)+g(y)-(5)$$

FIG. 10B shows the relationship between the input signal s and quantized code c' when such non-linear quantization is performed.

Specifically, the whole range of the amplitude (approximately −5 to +5 in FIG. 10B) available for signals (received signals) to be quantized is divided into a plurality of quantization steps with mutually different signal widths, and each quantization step is assigned an output code specific to the quantization step. For example, a quantization step 1003 with a signal width B is assigned an output code 6 specific to the quantization step 1003, while a quantization step 1004 with a signal width C is assigned an output code −5 specific to the quantization step 1004.

The width of each quantization step is determined based on the appearance probability of the amplitude of an input signal. Specifically, a quantization step corresponding to the amplitude with the high probability of an input signal having the amplitude is assigned a smaller signal width, while a quantization step corresponding to the amplitude with the low probability of an input signal having the amplitude is assigned a larger signal width. For example, a quantization step (quantization step 1003) corresponding to an input signal with the larger amplitude (for example, an input signal with the amplitude of 3) is assigned a larger signal width (signal width B), while a quantization step (quantization step 1005) corresponding to an input signal with the smaller amplitude (for example, an input signal with the amplitude of 0.5) is assigned a smaller signal width (signal width D(<B)).

Such non-linear quantization (FIG. 10B) is compared with the conventional linear quantization (FIG. 10A). Under the condition that the range of the signal width available for input signals is the same (in this case, approximately −5 to +5), codes of from approximately −13 to +13 are needed as output codes when the linear quantization is applied, while codes of from approximately −7 to +7 are needed as output codes when the non-linear quantization is applied.

In other words, applying the non-linear quantization suppresses the resolution required for coding the same input signal to be a lower degree than applying the linear quantization. There is a trade-off relationship between the resolution and conversion rate in the quantization, and therefore suppressing the resolution enables the conversion rate in the quantization to be increased.

When a communication is applied which increases a signal amount per communication band, the frequency of the received signal 150 from receiving section 101 in FIG. 9 is high, and therefore non-linearly quantizing section 901 needs to perform the quantization faster. If the above-mentioned non-linear quantization is applied in non-linearly quantizing section 901, the section 901 is capable of suppressing the resolution, and therefore is capable of increasing the conversion rate in the quantization. Accordingly, the digital reception apparatus according to this embodiment is capable of coping with the case where the communication is applied which increases a signal amount per communication band. The details of the non-linear quantization performed by non-linearly quantizing section 901 are as explained herein.

Referring to FIG. 9 again, a non-linear quantized code 950 obtained in non-linearly quantizing section 901 is output to linearly compensating section 902. Linearly compensating section 902 first generates a linear compensated signal 951 that is the linear with respect to the non-linear quantized code 951, using the quantization characteristic (relationship between the input signal and output code) in non-linearly quantizing section 901.

At this point, the non-linear processing f( ) is predetermined, and the inverse function F( ) can be pre-calculated also. Accordingly, generating the linear compensated signal 951 using the non-linear quantized code 950 is readily achieved using a conversion table. An example of the conversion table is explained with reference to FIGS. 11A and 11B. FIG. 11A is a schematic view illustrating an example of the conversion table (input signal versus non-linear quantized code) for use by non-linearly quantizing section 901 in the digital reception apparatus according to the ninth embodiment of the present invention. FIG. 11B is a schematic view illustrating an example of the conversion table (non-linear quantized code versus linearly compensated signal) for use by linearly compensating section 902 in the digital reception apparatus according to the ninth embodiment of the present invention.

When the received signal 150 is input to non-linearly quantizing section 901, the section 901 outputs to linearly compensating section 902 a non-linear quantized code corresponding to the input signal (received signal 150) in the conversion table, for example, shown in FIG. 11A. In addition, in the conventional method, a linear quantized code is output which corresponds to the input signal in the conversion table, for example, shown in the FIG. 11A.

After that, when the non-linear quantized code 950 is input to linearly compensating section 902, linearly compensating section 902 outputs to demodulating section 104 linearization information corresponding to the input code (non-linear quantized code 950) in the conversion table, for example, shown in FIG. 11B. In addition, performing the non-linear quantization and linear compensation using the conversion tables shown in FIGS. 11A and 11B is explained only as an example. It may be possible to achieve the non-linear quantization performed by non-linearly quantizing section 901 and the linear compensation performed by linearly compensating section 902 by respective calculation processing.

The linear compensated signal 951 obtained by linearly compensating section 902 is demodulated in demodulating section 104. A demodulated signal 952 is thereby obtained.

Generally, the processing performed by demodulating section 104 such as filtering, synchronization and equalization is linear signal processing that is executed on the assumption that the equation (5) is satisfied. In the linear quantized code that is subjected to the linear quantization, the linearity is maintained in the code itself. Accordingly, it is possible to subject the linear quantized code itself as the linear information to the signal processing such as calculation processing. Meanwhile, the non-linear quantized code that is subjected to the non-linear quantization does not satisfy the equation (5). Accordingly, it is not possible to subject the non-linear quantized code to the conventional signal processing. However, with respect to the non-linear quantized code subjected to the linearization described above, it is possible to perform the conventional demodulation in the same way as in the linear quantized code.

The quantization error is next explained. A quantized error Eq is given by the equation (6) shown below:

$$Eq = \sum_{k=-N/2}^{N/2} \int_{sk-1}^{sk} (vk - s)^2 p(s) ds \quad (6)$$

where N is the resolution, k is a quantized code, sk is a threshold level between a code k and a code k+1, vk is a weight of a quantized code k, s is a signal to be quantized, and p(s) is the appearance probability of the signal s. As can be seen from the equation (6), the quantization error Eq varies with sk and vk. In the present invention, the adjustment of sk and the adjustment of vk in the equation (6) are respectively performed by non-linearly quantizating section 901 and linearly compensating section 902. As indicated by the equation (6), respective values of sk and vk are determined by the appearing probability of a signal to be processed.

The effect of the quantization error provided by the equation (6) is not negligible in recent communications where the multiplexing system becomes complicated. Further, at the same time, with the communication signal band expanded, the demand has increased that requests to increase the conversion rate in a quantizer. Furthermore, in order to decrease effects due to the quantization error, offset, etc., attraction is also drawn to IF sampling that is a scheme for quantizing IF signals.

Using such a scheme is capable of principally canceling errors caused by the quadrature conversion. However, in the case of using the scheme, many subjects are concentrated on the quantizer. In other words, for example, the quantizer is required a high conversion rate, and further is required a high resolution because even noises and interfering signals which are not canceled in the IF band become signals to be processed by the quantizer.

In the present invention, using the non-linearly quantizing section and linearly compensating section enables quantization steps to be arranged optimally. The quantization steps are set suitably for the characteristics of signals to be quantized, whereby it is possible to suppress the occurrence of the quantization error to be fewer than the case of using the conventional linear quantization. It is thereby possible to use a quantizer with a less resolution.

In addition, the explanation in this embodiment is given of the case where the quantization characteristic of non-linearly quantizing section 901 is adapted to the characteristic of a signal to be quantized, however, the quantization characteristic may be determined by, as well as the modulated signal to be received, communication system environments and so on such as noises generated in a system, element, propagation path and the like, a modulated signal leaking from another channel other than the communicating channel, and an expected interfering signal. Further, as characteristics of a signal to be quantized, there are considered a signal amplitude distribution, immunity of a modulated signal to a distortion, characteristics of interfering signals from adjacent and secondly adjacent channels and so on. Most of them vary with the communication condition. Accordingly, the communication condition is estimated by the demodulation, and corresponding to the estimated result, the quantization characteristic is changed, whereby it is possible to reduce the power consumption. Specifically, for example, a quantization characteristic for suppressing the interfering signal is used as the characteristic of a signal to be quantized in the case where the inference with the adjacent channel is large, while the resolution on the quantization is decreased in the case where the received power is sufficiently high, whereby it is possible to reduce the power consumption.

Further, part of thresholds that are boundary values between quantized codes is made the same as the threshold used in the symbol decision of a signal to be processed, whereby it is possible to perform the symbol decision readily thereafter.

Furthermore, the case is explained where the non-linear distortion is generated by the operation of non-linearly quantizating section 901. However, as explained in each embodiment as described above, when a distortion is generated in an element in the receiving section, linearly compensating section 902 needs to perform the compensation considering the distortion generated in the element besides the non-linearity of non-linearly quantizing section 901. Moreover, non-linearly quantizing section 901 and linearly compensating section 902 may be composed of one device or one block.

As described previously, in the reception system using the IF sampling, it is difficult to design a filter that extracts only a desired signal from signals of IF band, and the IF signal itself has a higher frequency than the baseband signal. Accordingly, in such a reception system, a load on the quantizing section is large. Also in this point, the present invention is effective particularly on the IF sampling system.

While the case is explained in this embodiment that a non-linearly quantizing section is achieved by performing the non-linear processing prior to the linear quantization, a method for achieving the non-linearly quantizing section is not limited to the above case. For example, the non-linearly quantizing section may be achieved by making thresholds to be set for the quantization non-equal intervals, or if it is a type of $\Sigma \Delta$, by changing the noise shaping method, filter design, or the like.

Further, while the case is explained that linearly compensating section 902 is achieved by using the conversation table, any method is available to compose linearly compensating section 902 as long as the section has a function corresponding to the equation (4).

The digital reception apparatus according to this embodiment may be composed of the software (computer program) in its partially or wholly configuration, and also in this case, the same effects as described above are obtained. The digital reception apparatus of this embodiment is capable of being used in a combination with any of the digital reception apparatuses in the above-described embodiments.

Tenth Embodiment

Figure 12:
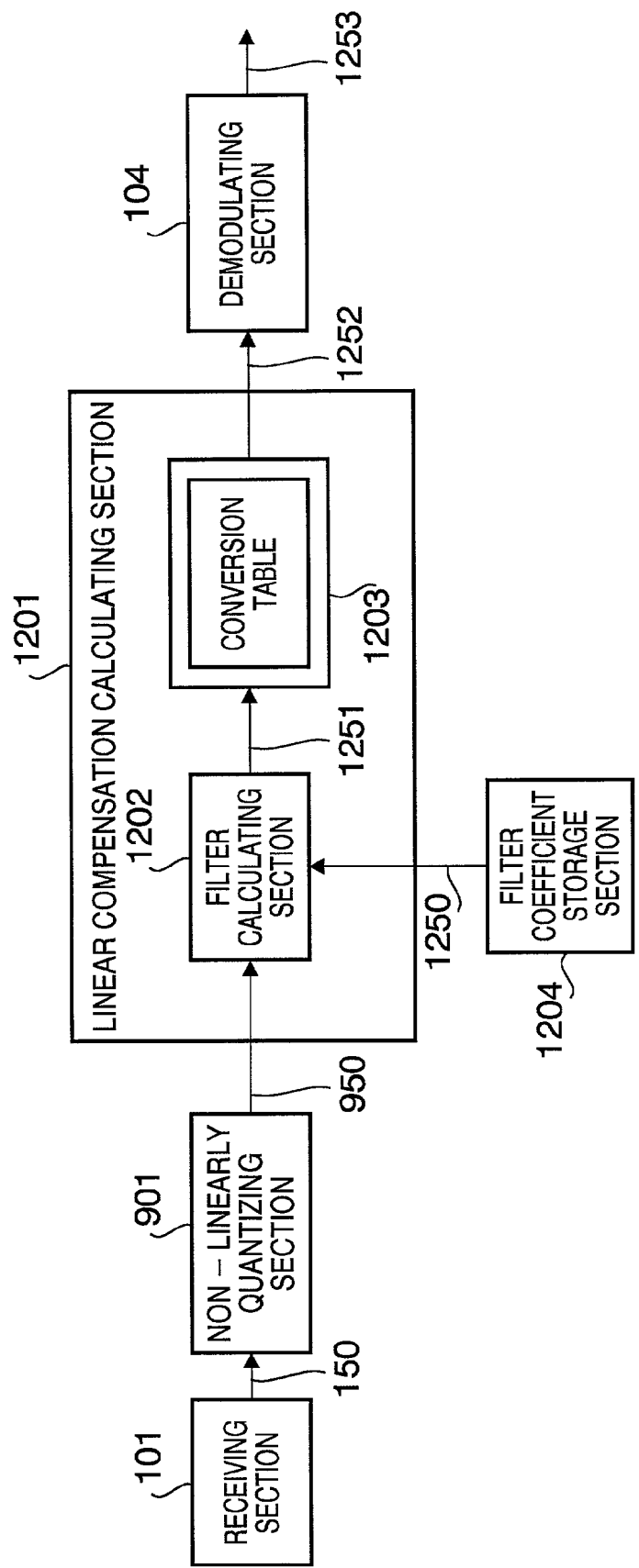
FIG. 12 is a block diagram illustrating a configuration of a digital reception apparatus according to a tenth embodiment of the present invention.

FIG. 12 is a block diagram illustrating a configuration of a digital reception apparatus according to the tenth embodiment of the present invention. In addition, in FIG. 12, the same sections as in the ninth embodiment (FIG. 9) are assigned the same reference numerals as in FIG. 9, and the detailed explanations are omitted.

The digital reception apparatus according to this embodiment is provided with receiving section 101, non-linearly quantizing section 901, linear compensation calculating section 1201 having filter calculating section 1202 and linearly compensating section 1203, filter coefficient storage section 1204, and demodulating section 104.

The operation of the digital reception apparatus with the above configuration is explained with attention only drawn to points different from the ninth embodiment. The non-linear quantized code 950 obtained in non-linearly quantizing section 901 is output to filter calculating section 1202 in linear compensation calculating section 1201.

Filter coefficient storage section 1204 stores filter coefficients for the filter calculation in filter calculating section 1202. Filter coefficient storage section 1204 outputs a filter coefficient signal 1250 indicative of the filter coefficients to filter calculating section 1202.

Linear compensation calculating section 1201 is mainly composed of filter calculating section 1202 and linearly compensating section 1203. Filter calculating section 1202 receives its inputs the non-linear quantized code 950 and filter coefficient signal 1250. Filter calculating section 1202 performs the filter calculation to the non-linear quantized code 950 using the filter coefficient signal 1250. A calculated signal 1251 is obtained by the filter calculation. The obtained calculated signal 1251 is linearized by linearly compensating section 1203, and then output to demodulating section 104 as a linearly calculated signal 1252. Demodulating section 104 demodulates the linearly calculated signal 1252, and thereby a demodulated signal 1253 is obtained.

It is assumed herein that non-linearly quantizing section 901 performs the quantization with a resolution of m bits, and that the filter coefficient signal 1204 output from filter coefficient storage section 1204 is a signal of n bits in its width.

As described previously, in the case of using the non-linear quantization, it is possible to achieve the quantization with the less resolution than the case of using the conventional linear quantization. This is indicative of that the case of using the non-linear quantization is capable of achieving the same reception performance as the case of using the conventional quantization with the less number of conditions (bits). If it is assumed that the resolution is decreased by x bits as compared to the case of using the conventional linear quantization, in the case of using the non-linear quantization, a signal having an information amount of m bits decreased by x bits is subjected to various calculations (for example, multiplication, division, addition, subtraction, etc.) in calculating circuits, and the thus calculated signal is subjected to the linear compensation processing, whereby it is possible to make configurations of the calculating circuits simpler.

Further, with respect to the calculated signal 1251 output from filter calculating section 1202, it may be possible to set a code length of the calculated signal 1251 to an optimal code length, using the appearance probability distribution of the calculated signal 1251. Furthermore, with respect to the filter coefficient signal 1250 output from filter coefficient storage section 1204, it may be possible similarly to set a code length of the filter coefficient signal 1250 to an optimal code length. It is thereby possible to represent the non-linear quantized code 950 output from non-linearly quantizing section 901 by the resolution of further decreased n' bits. Actually, the non-linear quantized code 950 and filter coefficient signal 1250 may be combined optimally to compose corresponding to conditions of communication signals, communication environments and so on, whereby it is possible to configure the calculating circuits further simply.

Thus, in this embodiment, a non-linearly quantized signal which is not linearly compensated (for example, the non-linear quantized signal 950 in FIG. 9) is subjected to various calculations by calculating circuits, instead of that a linearly compensated signal (for example, the linear compensated signal 951 in FIG. 9) is subjected to various calculations by calculating circuits. After that, the thus calculated signal is subjected to the linearizing compensation. It is thereby possible for calculating circuits (such as an adder and multiplier) to perform various calculations to a signal with the less number of conditions (bits), in other words, a signal with a small information amount. As a result, it is possible to configure the calculating circuits remarkably simply.

A fluctuation arises in the characteristic of a filter designed by analog elements due to errors of the analog elements. Accordingly, in a receiver particularly for use in a digital communication, a channel filter to select and extract only a desired received signal is often composed of a digital filter. The technical idea indicated in this embodiment has high compatibility with means for achieving the aforementioned digital filter. Further, it is possible to reduce the power consumption by using the technical idea indicated in this embodiment in a part requiring the operation with a high frequency such as the IF sampling technique, the filtering processing used in image cancellation performed after the digital quadrature demodulation, and the like.

The case is explained in this embodiment that the filter coefficient signal 1250 output from filter coefficient storage section 1204 is a linear signal. Further, it may be possible that filter coefficient storage section 1204 outputs a linear signal as the filter coefficient signal 1250, and that a converting section that converts a linear signal into a non-linear signal is installed between filter coefficient storage section 1204 and filter calculating section 1202. Thus, the linear signal output from filter coefficient storage section 1204 is converted into the non-linear signal in the converting section and then output to filter calculating section 1202.

Further, while the case is explained that each signal illustrated in FIG. 12 is represented by a constant code, each signal may be changed corresponding to an actual reception environment or the like. In this case, it is possible to suppress effects due to unexpected deterioration of environment characteristics and so on.

Furthermore, while the filter processing is explained as an example of the calculation processing, the same effects are obtained also in the case where another processing (for example, various arithmetic calculations) other than the filter processing is used as the calculation processing. In particular, a larger effect is obtained in the case where a multiplying circuit that increases the circuit scale is used as a circuit for performing the calculation processing.

While in this embodiment the case is explained that the logarithm conversion processing is used as the non-linear processing, it may be possible to use another processing other than the logarithm conversion processing as the non-linear processing. Also in this case, the same effects as described above are obtained.

The digital reception apparatus according to this embodiment may be composed of the software (computer program) in its partially or wholly configuration, and also in this case, the same effects as described above are obtained. The digital reception apparatus of this embodiment is capable of being used in a combination with any of the digital reception apparatuses in the above-described embodiments.

Eleventh Embodiment

Figure 13:
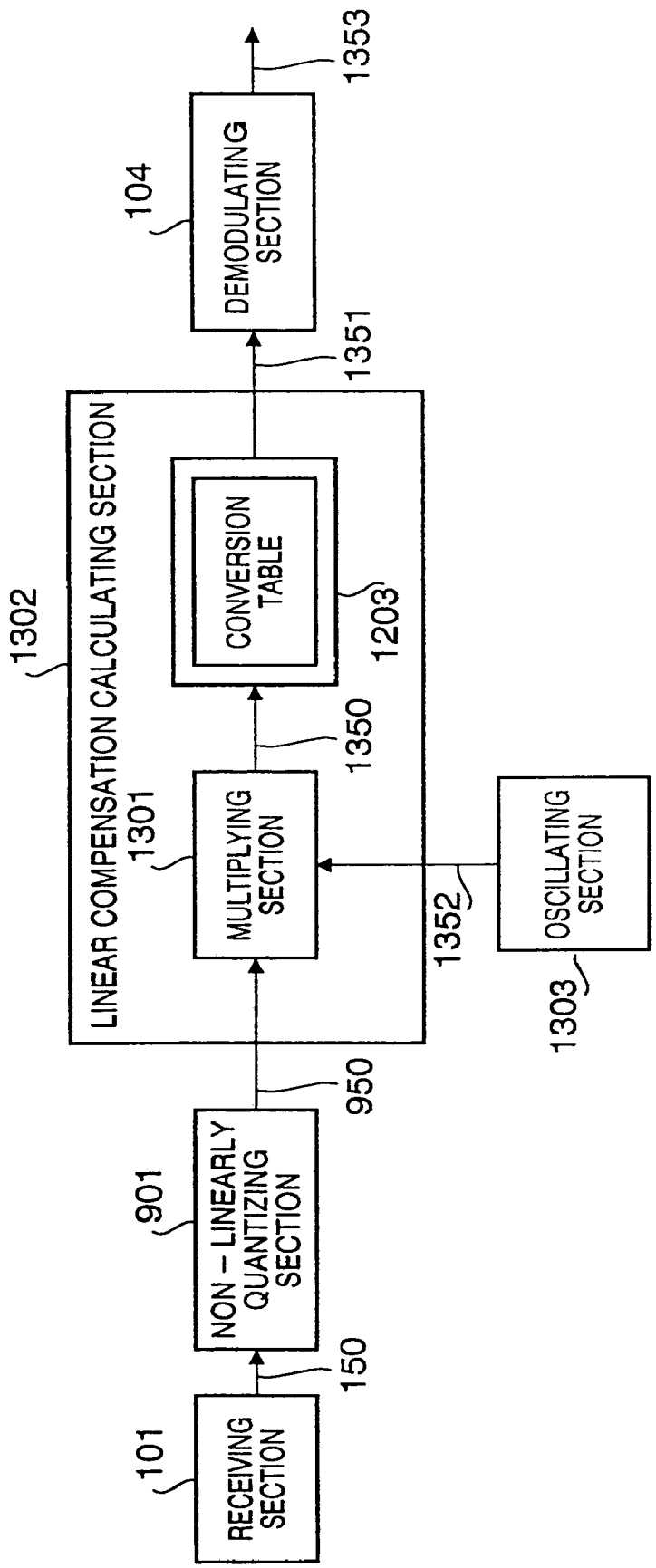
FIG. 13 is a block diagram illustrating a configuration of a digital reception apparatus according to an eleventh embodiment of the present invention.

FIG. 13 is a block diagram illustrating a configuration of a digital reception apparatus according to the eleventh embodiment of the present invention. In addition, in FIG. 13, the same sections as in the tenth embodiment (FIG. 12) are assigned the same reference numerals as in FIG. 12, and the detailed explanations are omitted.

The digital reception apparatus according to this embodiment is provided with receiving section 101, non-linearly quantizing section 901, linear compensation calculating section 1302 having multiplying section 1301 and linearly compensating section 1203, oscillating section 1303, and demodulating section 104.

The operation of the digital reception apparatus with the above configuration is explained with attention only drawn to points different from the tenth embodiment. The non-linear quantized code 950 obtained in non-linearly quantizing section 901 is output to multiplying section 1301 in linear compensation calculating section 1301.

Oscillating section 1303 outputs an oscillation signal 1352 composed of a reference frequency for the frequency conversion to multiplying section 1301. Linear compensation calculating section 1302 is mainly composed of multiplying section 1301 and linearly compensating section 1203.

Multiplying section 1301 receives its inputs the non-linear quantized code 950 and oscillation signal 1352. Multiplying section 1301 multiplies the non-linear quantized code 950 by the oscillation signal 1352. The multiplied result is linearized by linearly compensating section 1203, and then output to demodulating section 104 as a linear calculated signal 1351. Demodulating section 104 demodulates the linear calculated signal 1351, and thereby a demodulated signal 1353 is obtained.

It is herein assumed that as an example for simplifying the explanation, the non-linear processing given by the equation (3) described previously is a logarithmic variable given by the equation (7) shown below:

$$s'=\log(s) \quad (7)$$

Further, when it is assumed that the oscillation signal 1352 output from oscillating section 1303 is also a logarithmic signal, the calculated signal 1350 output from multiplying section 1301 in FIG. 13 is represented by the equation (8) shown below:

$$e'=\log(s \times lo)=\log(s)+\log(lo)=s'+lo' \quad (8)$$

where e' is the calculated signal 1350 represented by the logarithm, lo is the oscillation signal 1352, and lo' is the oscillation signal 1352 represented by the logarithm.

The conversion table in linearly compensating section 1203 stores in advance the conversion information that satisfies the equation (9) shown below:

$$e=\exp(e') \quad (9)$$

It is obvious that the linear calculated signal 1351 (e in the equation (9)) is a signal having the linearity.

As described above, it is obvious that multiplying section 1301 can be configured by a multiplier, and thereby can be achieved with an extremely ready configuration.

While the explanation in this embodiment is given of the case using the multiplication calculation as an example of the calculation processing, most of the signal processing is composed of mainly addition, subtraction, multiplication and part of division. Then, a plurality of code systems is used so that the signal processing is divided into the addition and subtraction, and multiplication and division, a calculating section for performing the addition and subtraction performs the processing with linear codes, and that another calculating section for performing the multiplication and division performs the processing with logarithmic codes, whereby the digital reception apparatus according to this embodiment is capable of coping with a lot of signal processing.

As described previously, in the case of using the non-linear quantization, it is possible to achieve the quantization with the less resolution than the case of using the conventional linear quantization. This is indicative of that the case of using the non-linear quantization is capable of achieving the same reception performance as the case of using the conventional quantization with the less number of conditions (bits).

In this embodiment, a non-linearly quantized signal which is not linearly compensated (for example, the non-linear quantized signal 950 in FIG. 9) is subjected to various calculations by calculating circuits, instead of that a linearly compensated signal (for example, the linear compensated signal 951 in FIG. 9) is subjected to various calculations by calculating circuits. After that, the thus calculated signal is subjected to the linear compensation. It is thereby possible for calculation circuits (such as an adder and multiplier) to perform various calculations to a signal with a less number of conditions (bits), in other words, a signal with a small information amount. As a result, it is possible to configure the calculation circuits remarkably simply.

In particular, as described in the above embodiment, in a receiver using the IF sampling, a digital converted received is often subjected to the quadrature demodulation. Accordingly, the technical idea indicated in this embodiment has high compatibility with the receiver using the IF sampling described above.

In this embodiment, the case is explained that the oscillation signal 1352 output from oscillating section 1303 to multiplying section 1301 is a non-linear signal represented by the logarithm, however, it may be also possible that the oscillation signal 1352 output from oscillating section 1303 is first input to a converting section to be subjected to the logarithm conversion, and that the converted signal is input to multiplying section 1301.

While the case is explained in this embodiment that the logarithm conversion is performed as the non-linear processing, the non-linear processing is not limited in particular. Also in other cases, the same effects as described above are obtained. Further, while the case is explained that the multiplication is used as a calculation to be processed on the non-linear quantized code, the calculation to be processed on the non-linear quantized code is not limited to only the multiplication, and may include addition and other arithmetic calculations.

The digital reception apparatus according to this embodiment may be composed of the software (computer program) in its partially or wholly configuration, and also in this case, the same effects as described above are obtained. The digital reception apparatus of this embodiment is capable of being used in a combination with any of the digital reception apparatuses in the above-described embodiments.

Twelfth Embodiment

Figure 14:
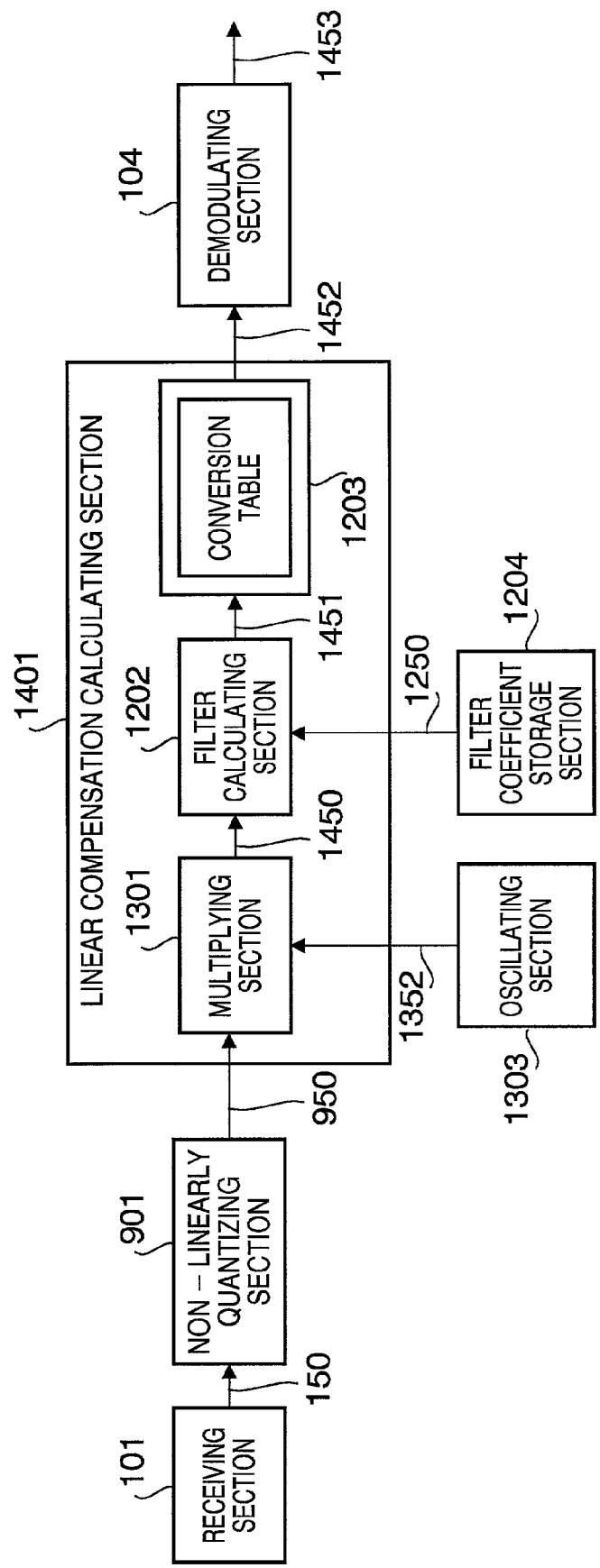
FIG. 14 is a block diagram illustrating a configuration of a digital reception apparatus according to a twelfth embodiment of the present invention.

FIG. 14 is a block diagram illustrating a configuration of a digital reception apparatus according to the twelfth embodiment of the present invention. In addition, in FIG. 14, the same sections as in the tenth embodiment (FIG. 12) and in the eleventh embodiment (FIG. 13) are assigned the same reference numerals as in FIG. 12 and FIG. 13, and the detailed explanations are omitted.

The digital reception apparatus according to this embodiment is provided with receiving section 101, non-linearly quantizing section 901, linear compensation calculating section 1401 having multiplying section 1301, filter calculating section 1202 and linearly compensating section 1203, filter coefficient storage section 1204, oscillating section 1303, and demodulating section 104.

The operation of the digital reception apparatus with the above configuration is explained with attention only drawn to points different from the tenth and eleventh embodiments. The non-linear quantized code 950 obtained in non-linearly quantizing section 901 is output to multiplying section 1301 in linear compensation calculating section 1401. Linear compensation calculating section 1401 is mainly composed of multiplying section 1301, filter calculating section 1202 and linearly compensating section 1203.

Oscillating section 1303 outputs the oscillation signal 1352 composed of a reference frequency for the frequency conversion to multiplying section 1301. Multiplying section 1301 receives its inputs the non-linear quantized code 950 and oscillation signal 1352. Multiplying section 1301 multiplies the non-linear quantized code 950 by the oscillation signal 1352. The multiplied result is output to filter calculating section 1202 as a multiplication calculated signal 1450. Filter calculating section 1202 has as input the filter coefficient signal 1250 from filter coefficient storage section 1204.

Filter calculating section 1202 performs the filter calculation to the multiplication calculated signal 1450 using the filter coefficient signal 1250. A filter calculated signal 1451 is obtained by the filter calculation. The obtained filter calculated signal 1451 is linearized by linearly compensating section 1203, and then output to demodulating section 104 as a linearly calculated signal 1452. Demodulating section 104 demodulates the linearly calculated signal 1452, and thereby a demodulated signal 1453 is obtained.

It is herein assumed that as an example for simplifying the explanation, non-linear processing given by the equation (3) is a logarithmic variable given by the equation (7).

Further, when it is assumed that the oscillation signal 1352 output from oscillating section 1303 is also a logarithmic signal, the multiplication calculated signal 1450 obtained in multiplying section 1301 in FIG. 14 is represented by the equation (8), where e' is the multiplication calculated signal 1450 represented by the logarithm, lo is the oscillation signal 1352, and lo' is the oscillation signal 1352 represented by the logarithm.

The code system of the multiplication calculated signal 1450 output from multiplying section 1301 is set to be an optimal code system, using the appearance probability distribution of a signal to be decoded and the calculation processing to be performed immediately thereafter (i.e., the filter calculation by filter calculating section 1202). As an example, when the variance of the handled signal is large and the calculation processing to be performed immediately thereafter mainly includes the multiplication, the code system of the multiplication calculated signal 1450 is set to codes based on the logarithm representation. Further when such calculation processing mainly includes the addition and requires the accuracy, the code system of the multiplication calculated signal 1450 is set to linear codes.

The code system of the filter coefficient signal 1250 output from filter coefficient storage section 1204 is assumed to the same code system as the multiplication calculated signal 1450 described above. The code system is set to be optimal, using the appearance probability distribution of the filter coefficient signal 1250 itself.

As described above, according to this embodiment, the optimal code systems are provided corresponding to respective appearance probability distributions of signals to be calculated and demodulated, whereby it is possible to largely reduce the power consumption, circuit scale and so on. Further, with respect to a plurality of calculation processing, the optimal code system is set for each input and output signal, whereby it is possible to suppress the scale of each calculation processing circuit to be a small scale. It is thereby possible to achieve the miniaturization and the reduced power consumption in the apparatus.

In this embodiment, the case is explained that multiplication and filter processing is used as the calculation processing, however, the same effects as described above are obtained also in the case where another processing is used as the calculation processing.

The digital reception apparatus according to this embodiment may be composed of the software (computer program) in its partially or wholly configuration, and also in this case, the same effects as described above are obtained. The digital reception apparatus of this embodiment is capable of being used in a combination with any of the digital reception apparatuses in the above-described embodiments.

Thirteenth Embodiment

Figure 15:
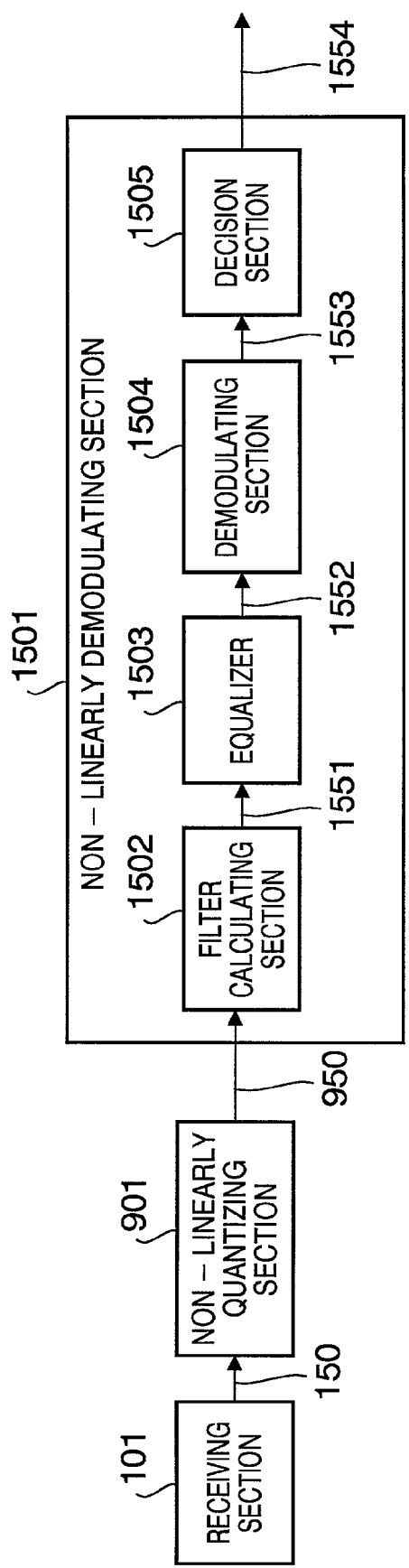
FIG. 15 is a block diagram illustrating a configuration of a digital reception apparatus according to a thirteenth embodiment of the present invention.

FIG. 15 is a block diagram illustrating a configuration of a digital reception apparatus according to the thirteenth embodiment of the present invention. In addition, in FIG. 15, the same sections as in the twelfth embodiment (FIG. 14) are assigned the same reference numerals as in FIG. 14, and the detailed explanations are omitted.

The digital reception apparatus according to this embodiment is provided with receiving section 101, non-linearly quantizing section 901, and non-linearly demodulating section 1501 having filter calculating section 1502, equalizer 1503, demodulating section 1504, and decision section 1505.

The operation of the digital reception apparatus with the above configuration is explained with attention only drawn to points different from the twelfth embodiment. The non-linear quantized code 950 obtained in non-linearly quantizing section 901 is converted into a signal represented by a code system optimal for the immediately-after calculation processing (i.e., the filter calculation in filter calculating section 1502), and then output to filter calculating section 1502 in non-linearly demodulating section 1502.

Filter calculating section 1502 performs the filter calculation using the non-linear quantized code 950 represented by the optimal code system, and predetermined filter coefficients. Further, the signal obtained by the filter calculation is converted into a signal represented by a code system optimal for the next calculation processing (i.e., equalizing processing in equalizer 1503). A filter signal 1551 is thereby obtained. The obtained filter signal 1551 is output to equalizer 1503.

Equalizer 1503 performs the equalizing processing on the filter signal 1551. Further, the signal obtained by the equalizing processing is converted into a signal represented by a code system optimal for the demodulation processing to be performed next (i.e., demodulation processing in demodulating section 1504). An equalized signal 1552 is thereby obtained. The obtained equalized signal 1552 is output to demodulating section 1504.

Demodulating section 1504 subjects the equalized signal 1552 to the demodulation processing and various controls such as received power control, frequency correction and synchronization processing. The signal obtained by the demodulation processing is converted into a signal represented by a code system optimal for the next calculation processing (i.e., decision processing in decision section 1505). A demodulated signal 1553 is thereby obtained. The obtained demodulated signal 1553 is output to decision section 1505.

Decision section 1505 performs symbol decision based on a threshold determined by an applied modulation scheme and the code system of the demodulated signal 1553. The signal obtained by the symbol decision is output as a decided signal 1554.

While in this embodiment, the case is explained that the processing performed by non-linearly demodulating section 1501 includes the filter calculation, equalizing processing, demodulating processing and decision processing, the processing performed by non-linearly demodulating section 1501 is not limited to the aforementioned calculation and processing, and may include all the general digital signal processing.

Further, while the case is explained that the hard decision is used such that decision section 1503 decides a symbol based on a threshold, it may be possible for decision section 1505 to use the soft decision that decides a symbol sequence with the most likelihood based on a transition of successive symbols.

In the method as the conventional technique where all the signal processing is processed with the same linear code, it is necessary to use the code system for coping with the case that the condition of a received signal is the worst, and therefore there is a problem that the scale of the apparatus becomes large.

However, in this embodiment, circuits are designed so that the optimal code system is set for each processing, and thereby it is possible to achieve the digital reception apparatus with a smaller circuit scale.

When the non-linear quantization is used where a width of each quantization step is determined based on the appearance probability of the amplitude of an input signal, the dynamic range is expanded as compared to the case of using the linear quantization, whereby stable characteristics are obtained even in receiving a signal with excessive power that is not expected.

The modulated signal has the number of conditions corresponding to the number of modulation degrees (i.e., M in M-phase PSK or M-level QAM) of the applied modulation scheme. In the conventional demodulation scheme, the signal processing is performed on a signal with a condition the most similar to that of an analog signal. Therefore, a large information amount is necessary even in a proportion that does not need information so much, providing problems that the circuit scale and power consumption is increased.

Hence in this embodiment, the attention is drawn to the problems, and an information amount is optimized with respect to each calculation processing, whereby the miniaturization and reduced power consumption in the whole apparatus can be achieved.

The digital reception apparatus according to this embodiment may be composed of the software (computer program) in its partially or wholly configuration, and also in this case, the same effects as described above are obtained. The digital reception apparatus of this embodiment is capable of being used in a combination with any of the digital reception apparatuses in the above-described embodiments.

Fourteenth Embodiment

Figure 16:
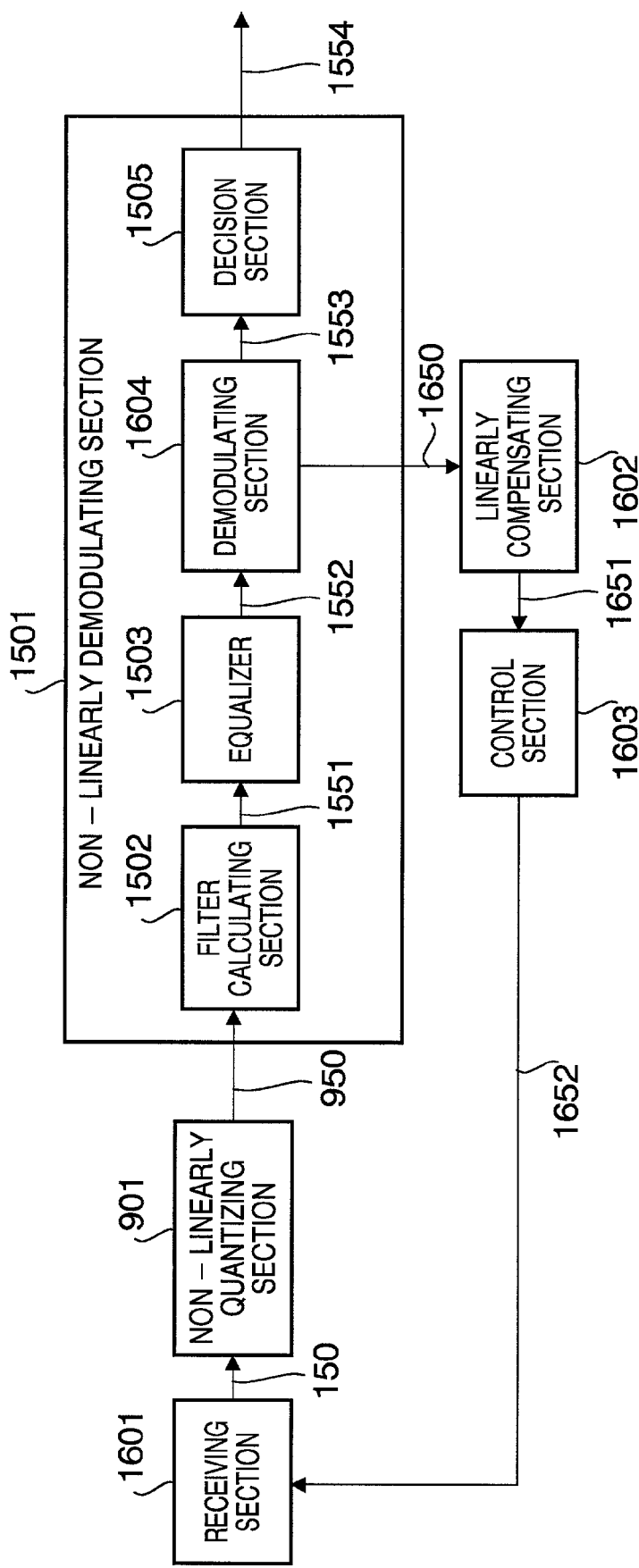
FIG. 16 is a block diagram illustrating a configuration of a digital reception apparatus according to a fourteenth embodiment of the present invention.

FIG. 16 is a block diagram illustrating a configuration of a digital reception apparatus according to the fourteenth embodiment of the present invention. In addition, in FIG. 16, the same sections as in the thirteenth embodiment (FIG. 15) are assigned the same reference numerals as in FIG. 15, and the detailed explanations are omitted.

The digital reception apparatus according to this embodiment is provided with receiving section 1601, non-linearly quantizing section 901, and non-linearly demodulating section 1501 having filter calculating section 1502, equalizer 1503, demodulating section 1604, and decision section 1505, linearly compensating section 1602, and control section 1603.

The operation of the digital reception apparatus with the above configuration is explained with attention only drawn to points different from the thirteenth embodiment.

Demodulating section 1504 performs the demodulation processing to the equalized signal 1552 as described previously. Further, from the signal obtained by the demodulation processing, various control information is extracted that includes information on the received power, information on a frequency error, and information on a timewise synchronization error. The extracted various information is output as a control information signal 1650 to linear compensating section 1602. In addition, the control information signal 1650 is a signal with no linearity maintained, in other words, a non-linear signal.

The control information signal 1650 output from demodulating section 1604 is subjected to linear compensation by linearly compensating section 1602, and then output to control section 1603 as a linear control information signal 1651 with the linearity maintained.

Using the linear control information signal 1651, control section 1603 generates a control signal 1652 including, for example, a gain adjustment control signal for instructing to adjust a gain in receiving section 1601, a frequency control signal for instructing to adjust a frequency in receiving section 1601, and a timing control signal for instructing to adjust a timing in a receiving section. The generated control signal 1652 is output to receiving section 1601. Receiving section 1601 performs various controls based on the control signal 1652.

An analog section (specifically, receiving section 1601) is comprised of various parts, and each part is designed to maintain the linearity with respect to a control signal.

In this embodiment, by performing the signal processing using the information with the non-linearity, it is possible to achieve the simplified circuit scale and reduced power consumption in a digital section (specifically, non-linearly demodulating section 1501). Further, the control signal output from the aforementioned digital section is subjected to the linear compensation, and thereby the linearity is maintained in the signal. Accordingly, it is possible to use analog elements that have been used conventionally, as a part composing the receiving section without modifying the elements. As a result, it is not necessary to re-design the analog section described above newly.

In this embodiment, by using only linear codes as control signals output from a digital section to an analog section, it is possible to readily achieve the connection between the digital section using the non-linear code and the analog section (controlled element) controlled by the digital section.

While in this embodiment, the case is explained that all the control signals 1652 are of linear codes, it may be possible to use appropriate information for a portion for which a decibel representation is appropriate and generalized, instead of using the linear code as the control signal 1652.

In the case where a controlled element has an error, for example, non-linear, with respect to a control signal, linearly compensating section 1602 may perform the linear compensation including such an error component, whereby it is possible to construct a control loop with less errors.

The digital reception apparatus according to this embodiment may be composed of the software (computer program) in its partially or wholly configuration, and also in this case, the same effects as described above are obtained. The digital reception apparatus of this embodiment is capable of being used in a combination with any of the digital reception apparatuses in the above-described embodiments.

The digital reception apparatus of each embodiment described above is capable of being carried into practice in a combination thereof as appropriate.

As described above, the digital reception apparatus according to the present invention disperses a quantization noise appropriately, thereby reduces the effect due to the quantization error, and therefore enables the use of a quantizing section with a configuration simpler than the conventional method. Further, the digital reception apparatus according to the present invention is capable of using a receiving section with a large distortion that has a difficulty in its use in the conventional method, and therefore the present invention enables the miniaturization, cost reduction and improved performance of the apparatus.

The digital reception apparatus according to the present invention is capable of replacing a receiving section with the high linearity, filtering section with the high performance, and quantizing section with a sufficient sampling rate and resolution, which have been required in particular in a system of using a plurality of channels in a broad communication band, with respective sections with simpler and inexpensive configurations.

Further, the digital reception apparatus according to the present invention has the high adaptability to broad band signals and signals applied modulation schemes with a high signal density, and therefore it is possible to flexibly change the modulation scheme to be handled.

The digital reception apparatus according to the present invention as described above is capable of being mounted on a communication terminal apparatus and base station apparatus in a digital mobile communication system.

As obvious to those skilled in the art, the present invention is capable of being carried into practice by using a commercially available general digital computer and microprocessor with software programmed according to techniques as described in the above embodiments. Further as obvious to those skilled in the art, the present invention includes computer programs made by those based on the techniques as described in the above embodiments.

The present invention includes computer program produces that are storage media including the programs capable of being executed by a computer for carrying out the present invention in practice. These storage media include disks such as a floppy disk, optical disk, CD-ROM and magnetic disk, ROM, RAM, EPROM, EEPROM, optomagnetic card, memory card and DVD, however, are not limited to the aforementioned materials.

The present invention is not limited to the above described embodiments, and various variations and modifications may be possible without departing from the scope of the present invention.

This application is based on the Japanese Patent Application No.2000-081226 filed on Mar. 23, 2000, entire content of which is expressly incorporated by reference herein.

What is claimed is:

1. A digital reception apparatus, comprising:
a receiver that performs reception processing on a received signal, the receiver comprising a non-linear quantizer that converts the received signal to a non-linear quantized signal;
a distortion converter that converts the non-linear quantized signal to a linear signal for demodulation, the distortion converter comprising a linear compensator, the non-linear quantized signal being input to the linear compensator which determines a correcting signal that is indicative of an inverse characteristic of the non-linear quantized signal, the correcting signal being utilized by the linear compensator to convert the non-linear quantized signal to the linear signal,
the linear compensator further comprising:
a filter calculator that performs a filter calculation on the non-linear quantized signal.

2. The digital reception apparatus according to claim 1, wherein the linear compensator corrects the non-linear distortion using at least a non-linear quantization characteristic of the quantizer.

3. The digital reception apparatus according to claim 1, wherein the received signal comprises an instantaneous signal.

4. A digital reception apparatus, comprising:
a receiver that performs reception processing on a received signal, the receiver comprising a non-linear quantizer that converts the received signal to a non-linear quantized signal;
a distortion converter that converts the non-linear quantized signal to a linear signal for demodulation, the distortion converter comprising a linear compensator, the non-linear quantized signal being input to the linear compensator which determines a correcting signal that is indicative of an inverse characteristic of the non-linear quantized signal, the correcting signal being utilized by the linear compensator to convert the non-linear quantized signal to the linear signal,
wherein the linear compensator comprises a distortion compensator that multiplies the received signal and the correcting signal to remove the non-linear distortion from the received signal.

* * * * *